United States Patent
Ishii et al.

(10) Patent No.: US 7,791,943 B2
(45) Date of Patent: Sep. 7, 2010

(54) NONVOLATILE SEMICONDUCTOR MEMORY DEVICE

(75) Inventors: Motoharu Ishii, Itami (JP); Seiichi Endo, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/571,917

(22) Filed: Oct. 1, 2009

(65) Prior Publication Data
US 2010/0014355 A1 Jan. 21, 2010

Related U.S. Application Data

(62) Division of application No. 12/010,020, filed on Jan. 18, 2008, now abandoned, which is a division of application No. 11/411,933, filed on Apr. 27, 2006, now Pat. No. 7,342,828.

(30) Foreign Application Priority Data
Apr. 28, 2005 (JP) ............... 2005-132441

(51) Int. Cl.
G11C 11/34 (2006.01)
(52) U.S. Cl. .............. 365/185.18; 365/185.24
(58) Field of Classification Search ............ 365/185.18, 365/185.24, 185.05
See application file for complete search history.

(56) References Cited

U.S. PATENT DOCUMENTS

| | | | |
|---|---|---|---|
| 5,990,514 A | 11/1999 | Choi et al. | |
| 6,067,249 A | 5/2000 | Lee et al. | |
| 6,067,251 A * | 5/2000 | Hirano | 365/185.18 |
| 6,114,724 A | 9/2000 | Ratnakumar | |
| 6,162,682 A | 12/2000 | Kleine | |
| 6,396,745 B1 | 5/2002 | Hong et al. | |
| 6,512,253 B2 | 1/2003 | Watanabe et al. | |
| 6,747,901 B2 * | 6/2004 | Hirano | 365/185.29 |
| 7,301,195 B2 * | 11/2007 | Nakajima et al. | 257/315 |
| 7,397,699 B2 * | 7/2008 | Trinh | 365/185.18 |

FOREIGN PATENT DOCUMENTS

| JP | 07-297304 | 11/1995 |
|---|---|---|
| JP | 2001-015617 | 1/2001 |

OTHER PUBLICATIONS

Chinese Office Action, w/ English translation, issued in Chinese Patent Application No. CN 200610077234.1, date Apr. 10, 2009.

* cited by examiner

*Primary Examiner*—Anh Phung
(74) *Attorney, Agent, or Firm*—McDermott Will & Emery LLP

(57) ABSTRACT

In a nonvolatile memory cell, a selection transistor is connected to a memory cell transistor in series. The selection transistor is formed into a double layer gate structure, and has a voltage of each gate driven individually and separately. Using capacitive coupling between these stacked gate electrode layers of the selection transistor, a gate potential of the selection transistor is set to the predetermined voltage level. An absolute value of the voltage level generated by a voltage generator to the gates of the selection transistor can be made small, so that current consumption can be reduced and an layout area of the voltage generator can be reduced. Thus, a nonvolatile semiconductor memory device with a low current consumption and a small chip layout area is provided.

1 Claim, 17 Drawing Sheets

WRITING:

ERASURE:

NONVOLATILE SEMICONDUCTOR MEMORY DEVICE

RELATED APPLICATIONS

This application is a Divisional of U.S. patent application Ser. No. 12/010,020, filed on Jan. 18, 2008 now abandoned, which is a Divisional of U.S. patent application Ser. No. 11/411,933, filed on Apr. 27, 2006, now U.S. Pat. No. 7,342,828, claiming priority of Japanese Patent Application No. 2005-132441, filed on Apr. 28, 2005, the entire contents of each of which are hereby incorporated by reference.

BACKGROUND OF THE INVENTION

1. Field of the Invention

The present invention relates to a nonvolatile semiconductor memory device and particularly to a nonvolatile semiconductor memory device integrated on a common same semiconductor substrate (chip) with a logic circuit such as a processor. More specifically, the present invention relates to a construction for reducing power consumption and occupying area of the nonvolatile semiconductor memory device and for reading data at high speed.

2. Description of the Background Art

Semiconductor memory devices that store information in a nonvolatile manner include a flash memory. In the flash memory, a memory cell is formed of one stacked gate field effect transistor (memory cell transistor) having a floating gate. An electric field is applied to the floating gate to perform injection/extraction of electric charges (electrons) on the floating gate through an F-N (Fowler-Nordheim) tunneling phenomenon or a Channel Hot Electron phenomenon, for changing a threshold voltage of the memory cell transistor. For different threshold voltages of the memory cell transistor, different amounts of current flow through the memory cell upon selection of the memory cell, to store data according to the amount of current. In the case where an n-channel transistor is used for the memory cell transistor, a state in which electrons are injected into the floating gate is a state in which the threshold voltage is high, while a state in which the electrons are extracted from the floating gate is a state in which the threshold voltage is low. According to the quantity of accumulated electric charges (quantity of accumulated electrons) at this floating gate, a state in which a current starts to flow when the gate voltage is set to set to 6.5 V or higher and a state in which a current flows when the gate voltage is even at 4.0 V can be implemented. Accordingly, when the gate voltage is set to an intermediate voltage of, for example, 5.0 V in reading data, the state in which the current flows and the state in which substantially no current flows through the memory cell transistor are discriminated. The state of the memory cell data can be identified to read out data by sensing the amount of current flowing the memory cell transistor.

When the injection/extraction of electrons is performed on the floating gate to store data, a problem of "over-erasure" needs to be considered. The "over-erasure" represents a state in which the electrons are excessively extracted from the floating gate (in the case where the memory cell transistor is an n-channel transistor), rendering the threshold voltage 0.0 V or lower, and accordingly, a current flows even when the memory cell is in a non-selected state, that is, a state similar to a so-called depletion state of an MOS transistor (insulated gate field effect transistor). Normally, in reading data, a gate potential of a selected memory cell transistor is set to an intermediate potential, while a non-selected memory cell has a gate potential of kept at 0.0 V and is set to a state of causing no current flow in a normal state. In reading data, the current flowing through the selected memory cell is sensed by a sense amplifier. However, when the non-selected memory cell is in the over-erasure state, the current flows through this non-selected memory cell, and, there arises a problem that the data is determined based on a combined current of the selected memory cell and the non-selected memory cell in the over-erasure state in the sense amplifier, resulting in erroneous reading.

In the memory cell transistor, there is variation in physical property such as film thickness and film quality due to variation in manufacturing parameter during the manufacturing process, and accordingly, there arises variation in electric characteristics, extraction/injection speeds of electrons for the floating gate vary within a certain range. Thus, when the electrons are extracted from the floating gate to set a threshold voltage to a low state, there is possibility that a memory cell transistor from which the electrons are excessively extracted is produced even under the same voltage applying condition, so that the memory cell transistor in the over-erasure state is present. Consequently, in order to prevent such over-erasure, the threshold voltage of the memory cell transistor can not be set sufficiently low, and thus, the problem arises that the data cannot be read under a low power supply voltage.

In order to avoid such over-erasure, the distribution of the threshold voltages needs to be precisely controlled by performing erasure verification in writing data. However, when the erasure verification operation is performed for each bit to control the threshold voltage distribution, the processing takes a long time and the processing sequence becomes complicated, which causes a problem that high speed data writing/ erasure cannot be achieved. Furthermore, the complexity of the erasure verification sequence leads to an increased cost and becomes an obstacle against achieving a low cost memory device.

In order to solve the above-described problem of over-erasure, a construction in which a cell structure of EEPROM (Electronically Erasable and Programmable Read Only Memory) is utilized is disclosed in Prior Art Document 1 (Japanese Patent Laying-Open No. 2001-015617). In the construction shown in Prior Art Document 1, a memory cell transistor is formed of a stacked gate field effect transistor, and a selection transistor is connected to the memory cell transistor in series. A source node of the memory cell transistor is coupled to a source line. In reading data, the selection transistor is made conductive and the memory cell transistor is coupled to a bit line to form a path for causing a current flow between the bit line and the source line. As for a non-selected memory cell, the selection transistor is in a non-conductive state, and even if the memory cell transistor is in an over-erasure state, the non-selected memory cell is isolated from the bit line, so that the current flowing path between the bit line and the source line is shut off. Accordingly, the non-selected memory cell, even in the over-erasure state, can be prevented from influencing the reading current of the selected memory cell. In Prior Art Document 1, stacked gate layers formed in the same manufacturing steps as those of the floating gate and a control gate of the memory cell transistor are used as a control electrode (selection gate), and these electrode layer corresponding to the control gate and electrode layer corresponding to the floating gate are electrically shorted to equivalently implement a single gate MOS transistor.

In the case where the flash memory cell structure is utilized, in order to avoid the problem of over-erasure, the threshold voltage cannot be sufficiently reduced. Accordingly, in selecting a memory cell, a voltage level applied to the control gate needs to be internally boosted in a positive or negative direction, and thus, an external power supply voltage (non-boosted) cannot be utilized without conversion, which causes a problem of an increase in power consumption. Furthermore, a charge pump circuit for boosting needs to be internally provided, which causes a problem of an increase in chip area.

When a gate potential of a selected memory cell is set using a boosting pump, the data cannot be read until the boosted voltage becomes stable, and thus, high speed data reading cannot be achieved. Furthermore, when the capacity of the boosting pump is insufficient, there arises a problem that the amount of current consumed in memory cell selection cannot be sufficiently compensated for, and that thus, the boosted voltage cannot be stably generated and supplied, so that the memory cells cannot be successively selected for reading data.

As disclosed in Prior Art Document 1, in the case where the memory cell structure is comprised of a series body of a stacked gate field effect transistor and a selection transistor, the problem of the over-erasure can be avoided even when the threshold voltage of the stacked gate field effect transistor is set low. In the memory cell structure disclosed in Prior Art Document 1, the selection transistor is equivalently formed of a single gate MOS transistor. Accordingly, when the memory cell transistor formed of the stacked gate field effect transistor is coupled to a corresponding bit line, in order to reliably cause current amount change on the bit line according to the storage data of the memory cell without being influenced by the threshold voltage of the selection transistor, it is necessary to render the gate voltage of the selection transistor high for transmitting, to the memory cell transistor, the reading voltage supplied to the bit line without threshold voltage loss and without voltage drop by its channel resistance.

In Prior Art Document 1, in a logic merged device with the memory device and a logic circuit being integrated on a common chip, in order to avoid the aluminum penetration of the electrode interconnection line which may caused when the selection transistor is implemented using the gage electrode layer the same as the floating gate to make the gate electrode thickness of the selection transistor thin for achieving the flattening of the logic merged device, the interconnection lines of the same layers as the control gate layer and the floating gate layer of the stacked gate field effect transistor are used and are shorted with each other. In Prior Art Document 1, no consideration is given to neither the problem associated with the gate potential of the selection transistor nor the electrical characteristics such as current dissipation.

SUMMARY OF THE INVENTION

An object of the present invention is to provide a nonvolatile semiconductor memory device with a small occupying area that can read data at high speed with low current consumption.

A nonvolatile semiconductor memory device according to a first aspect of the present invention includes a memory cell transistor that stores information in a nonvolatile manner, and a selection transistor that is connected to the memory cell transistor in series, for enabling the reading of stored data of the memory cell transistor when made conductive. The selection transistor includes first and second conductive layers aligned with each other and having their voltage levels settable individually.

The nonvolatile semiconductor memory device according to the first aspect of the present invention further includes a first voltage setting circuit that sets a voltage of the first conductive layer of the selection transistor, and a second voltage setting circuit that sets a voltage of the second conductive layer of the selection transistor.

A nonvolatile semiconductor memory device according to a second aspect of the present invention includes a memory cell including an electric charge accumulation region that stores information in the form of electric charges, a first conductive layer formed on the electric charge accumulation region, and a second conductive layer formed above the first conductive layer in alignment with the first conductive layer, a first voltage setting circuit that sets a voltage of the first conductive layer, and a second voltage setting circuit that sets a voltage of the second conductive layer individually and separately from the first conductive layer.

A nonvolatile semiconductor memory device according to a third aspect of the present invention includes a memory cell that is formed on a substrate region of a first conductivity type and stores information in a nonvolatile manner. The memory cell includes an electric charge accumulation region that is formed on the substrate region and stores the information in the form of electric charges, and a control electrode layer that is formed on the electric charge accumulation region and to which a voltage for writing or reading the storage information of the memory cell is applied.

The nonvolatile semiconductor memory device according to the third aspect of the present invention further includes a bottom well region of a second conductivity type formed so as to surround the substrate region, a first voltage control circuit that sets a voltage of the substrate region, and a second voltage control circuit that operates separately from the voltage setting of the first voltage control circuit and sets a voltage of the bottom well region according to an operation mode to adjust the voltage level of the substrate region.

In the nonvolatile semiconductor memory device according to the first aspect of the present invention, the memory cell is configured of a series body of a stacked gate transistor and a stacked gate selection transistor. By setting the voltage level for the stacked gates of the selection transistor individually, boosting operation can be achieved through capacitive coupling through the use of a capacitance between the gate electrodes of the selection transistor, to boost the gate voltage of the selection transistor in a positive or negative direction. This can decrease the level of the generated voltage by the charge pump circuit for boosting the gate voltage of the selection transistor, and accordingly, the scale of the charge pump circuit can be reduced, so that the chip area can be reduced and further, the current dissipation can be reduced. Furthermore, when the voltage amplitude of the first and the second conductive layers is set to the power supply voltage level, the boosting charge pump circuit becomes unnecessary, and accordingly, the consumption current and the chip layout area can be reduced further.

In the nonvolatile semiconductor memory device according to the second aspect of the present invention, the first and second conductive layers are stacked above the electric charge accumulation region and the voltages of these first and second conductive layers are set individually. Accordingly, an electric field applied to the electric charge accumulation layer can be increased through the capacitive coupling between the first and second conductive layers. Thereby, in the case of one-transistor cell structure that a memory cell is formed of the electric charge accumulation region and the first and second conductive layers, even when the absolute value of a threshold voltage is set to a relatively high value and even when the generated voltage level of the charge pump circuit is set to a low level, a voltage of a sufficient level can be applied to the control electrode of the memory cell transistor as the gate voltage, so that high speed and stable data reading with a low current consumption can be achieved. Furthermore, when a signal of a power supply voltage amplitude is supplied to the first and second conductive layers, a charge pump circuit for generating the boosted voltage becomes unnecessary, which can sufficiently reduce the current consumption and the chip layout area.

Consequently, the charge pump circuit for generating the boosted voltage can be eliminated or the scale thereof can be reduced, which can reduce the chip area and the current consumption.

In the nonvolatile semiconductor memory device according to the third aspect of the present invention, the voltage level of the bottom well region surrounding the substrate region is set separately from the substrate region voltage. Accordingly, the junction capacitance between the substrate region and the bottom well region which are different in conductivity type, can be utilized to change the voltage level of the substrate region. Accordingly, a high electric field can be applied between the electric charge accumulation region and the substrate region, and the injection or extraction of electric charges to or from the electric charge accumulation region can be achieved. In this case, a charge pump circuit for generating the voltage for electric charge extraction/injection can be unnecessary or the scale thereof can be reduced, which can reduce the chip area and the current consumption.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Embodiment 1

Figure 1:
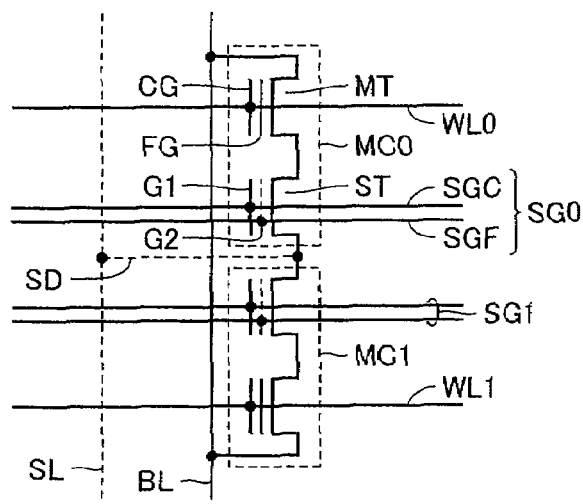
FIG. 1 is a diagram showing an electric equivalent circuit of memory cells according to Embodiment 1 of the present invention.

FIG. 1 is a diagram showing an electrical equivalent circuit of memory cells according to Embodiment 1 of the present invention. In FIG. 1, memory cells MC0 and MC1 of two bits are shown representatively. Since memory cells MC0 and MC1 have the same construction, reference numerals are allotted to components of memory cell MC0 in FIG. 1. Memory cell MC0 includes a memory transistor MT and a selection transistor ST which are connected in series between a bit line BL and a source line SL. Memory transistor MT includes a floating gate FG that stores information in the form of electric charges and a control gate CG formed above floating gate FG and connected to a word line WL0. Control gate CG is used to refer to a gate electrode arranged for each individual memory cell and word line WL (WL0, WL1) is used to refer to an interconnection line arranged extending continuously in a row direction for one row of memory cells and connecting to the control gates of the memory cell transistors on the corresponding.

Selection transistor ST has the same configuration as that of memory cell transistor MT, and includes a conductive layer (hereinafter, referred to as a lower layer gate electrode) G2 which is at the same layer as floating gate FG and a conductive layer (hereinafter, referred to as an upper layer gate electrode) G1 which is at the same layer of control gate CG. Upper layer gate electrode G1 is coupled to a first selection gate line SGC and lower layer gate electrode G2 is connected to a second selection gate line SGF. These selection gate lines SGC and SGF are arranged in alignment with each other to provide one selection control line SG0 of a multilayer structure.

Gate electrodes G1 and G2 are used to refer to the individual gates of selection transistor of each memory cell and selection gate lines SGC and SGF are each used to refer to an interconnection line arranged for one row of memory cells, and are coupled to upper layer and lower layer gate electrodes G1 and G2, respectively.

By setting selection gate lines SGC and SGF individually and separately, a gate potential of selection transistor ST is set to a desired potential level, through the use of capacitive coupling between gate electrodes G1 and G2 (between selection gate lines SGC and SGF).

For memory cell MC1, selection gate line SG1 is provided for the selection transistor and word line ML1 is provided for the memory cell transistor. Selection transistors ST of memory cell MC0 and MC1 are connected to source line SL through a common source diffusion layer SD. Memory transistors MT of memory cells MC0 and MC1 are coupled to bit line BL.

In each of memory cells MC0 and MC1, by connecting memory transistor MT and selection transistor ST in series between the bit line and the source line and rendering selection transistor ST conductive, a path through which a current flows is formed between bit line BL and source line SL in the corresponding memory cell.

Figure 2:
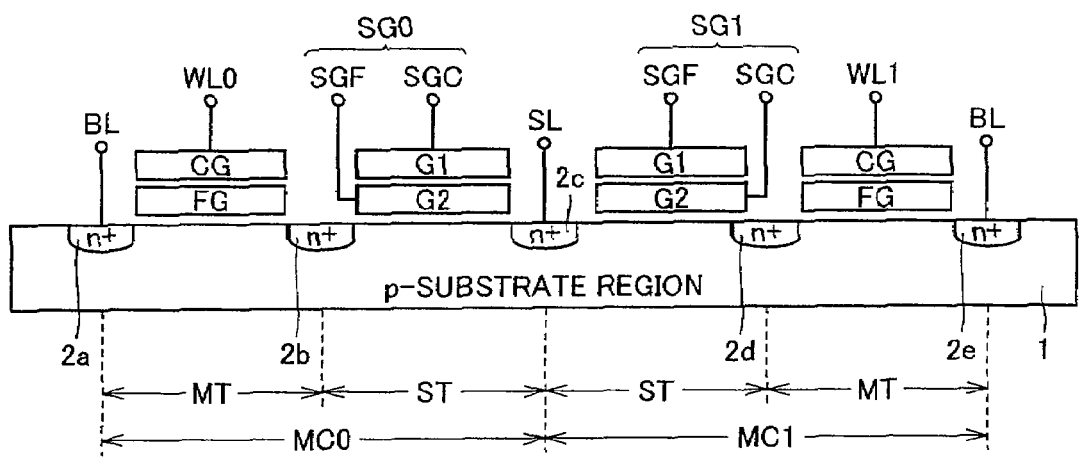
FIG. 2 is a diagram schematically showing a cross-sectional structure of the memory cells of Embodiment 1 of the present invention.

FIG. 2 is a diagram schematically showing a cross-sectional structure of memory cells MC0 and MC1 shown in FIG. 1. In FIG. 2, memory cells MC0 and MC1 are formed on a p-type semiconductor substrate region 1. Impurity regions 2a, 2b, 2c, 2d and 2e are formed apart from one another on a p-type substrate 1 surface. Floating gate FG and control gate CG are formed in alignment on the substrate region surface between impurity regions 2a and 2b and gate electrodes G2 and G1 are formed on the substrate region surface between impurity regions 2b and 2c sequentially in alignment with each other. Memory cell MC0 is formed by the region between impurity regions 2a and 2c, and control gate CG is connected to word line WL. Gate electrodes G1 and G2 are connected to selection gate lines SGC and SGF, respectively.

Impurity regions 2a and 2c are coupled to bit line BL and source line SL, respectively. This impurity region 2c corresponds to source diffusion layer SD shown in FIG. 1.

Memory cell MC1 is formed by the region between impurity diffusion layers 2c and 2e. Gate electrodes G2 and G1 are formed sequentially on the p-type semiconductor substrate region 1 surface between impurity regions 2c and 2d. Floating gate FG and control gate CG are formed sequentially on the substrate region surface between impurity regions 2d and 2e. Control gate CG1 of memory cell MC1 is connected to word line WL1. Lower and upper layer gate electrodes G2 and G1 of the selection transistor of memory cell MC1 are coupled to selection gate lines SGC and SGF, respectively. In memory cells MC0 and MC1, the double layer interconnection structure of selection gate lines SGC and SGF provides the corresponding selection control lines SG0 and SG1.

Gate electrodes G1 and G2 are produced in the same interconnection manufacturing steps as those of floating gate FG and control gate CG, respectively, and no additional steps for producing selection transistor ST is not required. Simply, lower layer gate electrode G2 is arranged continuously extending in the row direction, and floating gate FG is arranged corresponding to each memory cell, and formed isolatedly and separately for each memory cell. In one memory cell, memory transistor MT and selection transistor ST are formed of stacked gate MOS transistors having the same structure.

Gate electrodes G1 and G2 have the voltage level set individually through selection gate lines SGC and SGF when selected.

In each of memory cells MC0 and MC1, a threshold voltage of memory transistor MT is determined according to the quantity of accumulated electric charges (quantity of accumulated electrons) in floating gate FG. On the other hand, in each of memory cells MC0 and MC1, conduction/non-conduction of selection transistor ST is set by the potential of lower layer gate electrode G2. The potential of lower layer gate electrode G2 is set through selection control line SG (SG0, SG1) by a voltage setting circuit not shown in the figure. Accordingly, when selection transistor ST is in an OFF state (non-conduction state), even if memory transistor MT of a non-selected memory cell is in an over-erasure state, the non-selected memory cell is isolated from bit line BL and source line SL by selection transistor ST, and thus, the path through which a current flows in the memory cell in the over-erasure state is cut off, which prevents the memory cell in the over-erasure state from exerting an adverse effects on the current flowing through the selected memory cell.

Figure 3:
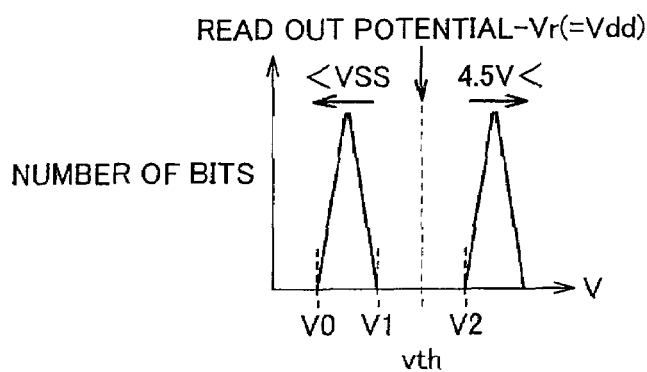
FIG. 3 is a diagram showing the distribution of threshold voltages of the memory cells according to Embodiment 1 of the present invention.

FIG. 3 is a diagram schematically showing the distribution of threshold voltages Vth of the memory cell transistors. In FIG. 3, horizontal axis indicates a voltage V and the vertical axis indicates the number of bit. The memory cells in a state of low threshold voltages (hereinafter, referred to as erasure state) are distributed between threshold voltages V0 and V1. On the other hand, the threshold voltages of the memory cell transistors in a state of high threshold voltages (hereinafter, referred to as writing (programmed) state) are at a higher voltage level than a voltage V2. The relationship between the threshold voltages and the programmed and erasure states of the memory cell transistor may be reverse.

In reading memory cell data, a read out potential Vr is applied to word line WL. Read out potential Vr is set to a level between threshold voltages V1 and V2 of the memory cell transistor. If the lower limit V2 of the threshold voltage of the memory cell transistor in the programmed state is, for example, 4.5 V or higher and the upper limit V1 of the threshold voltage of the memory cell transistor in the erasure state is, for example, 2 V or lower, then by supplying a power supply voltage Vdd (=3.3 V) as read out potential Vr, the memory cells in the erasure state and the programmed state can be selectively set to the conduction and non-conduction states, respectively. Accordingly, when word line WL0 or WL1 is selected, the voltage level can be set using the power supply voltage supplied externally, so that boosting operation is not required.

As compared with a conventional construction in which in order to avoid the over-erasure state, the upper limit of the threshold voltage of the memory cell transistor in the erasure state is set to 4.2 V or higher, the lower limit of the threshold voltage of the memory cell transistor in the programmed state is set to 6.5 V, and 5.5 V is applied as read out potential Vr, the boosting operation is not required, which can reduce the current consumption. Furthermore, a circuit for this boosting is not required, which can reduce the chip area.

Since a memory cell of one bit is comprised of two transistors, a layout area of a memory cell array increases for achieving the same storage capacity as compared with a case where a memory cell of one bit is comprised of one transistor. However, an effect of reducing or eliminating a layout area of a charge pump circuit is larger than effect of an increase in size of the memory cell, so that the chip area can be sufficiently reduced.

Furthermore, the threshold voltage of memory cell transistor MT in the erasure state is not particularly required to be higher than an ground voltage Vss. Since the over-erasure state is permitted, a low-side threshold voltage V0 of memory cell transistor MT in the erasure state may be set to lower than ground voltage Vss. Accordingly, in the erasure operation, the writing back process for setting the threshold voltage to higher than the ground voltage in erasure verification operation is not required, which simplifies the erasure sequence.

Furthermore, verification operation to determine whether the data can be read precisely without being influenced by the over-erased memory cell is not required, which can simplify the writing sequence, so that a construction of a sequencer for executing the control of writing/erasure can be simplified and thus, its layout occupying area can be reduced.

Figure 4:
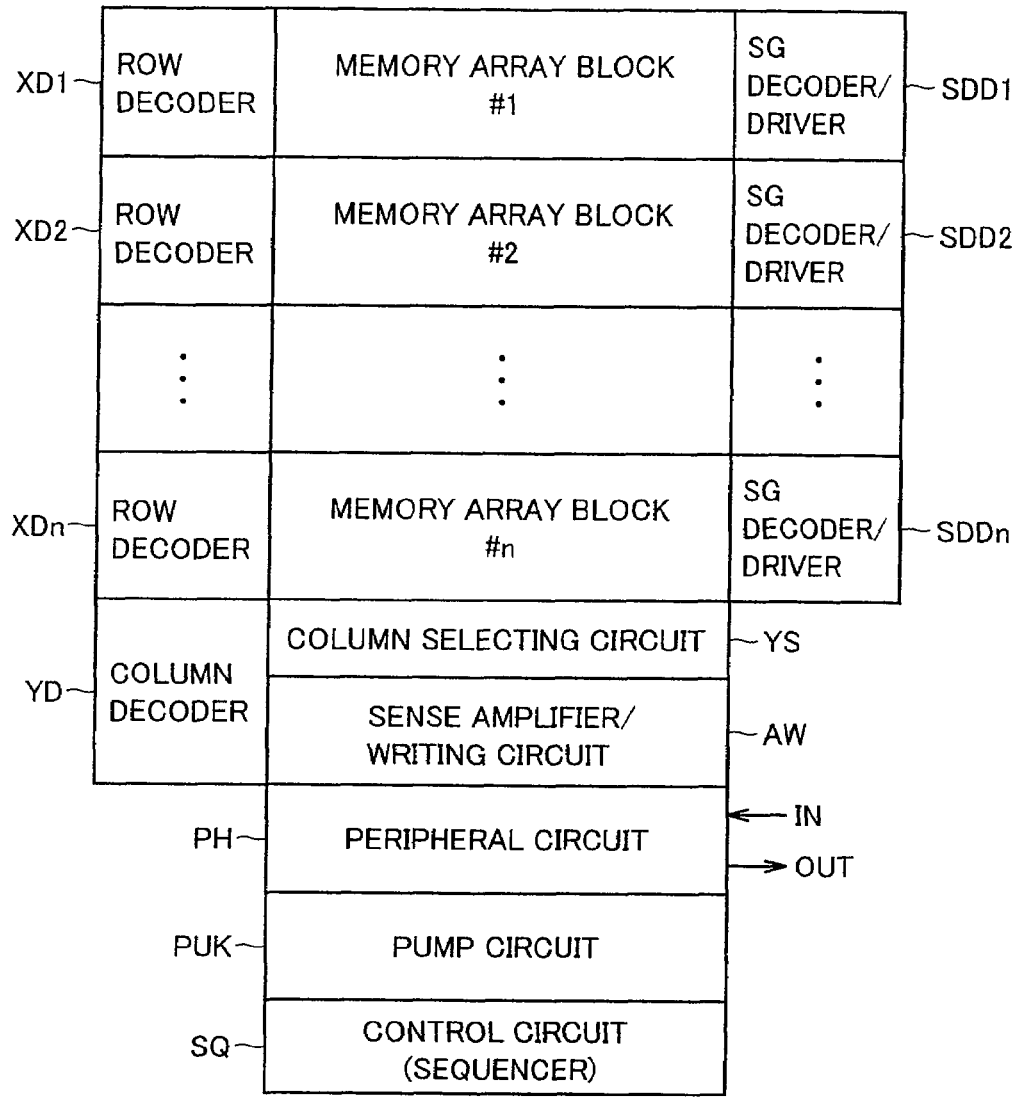
FIG. 4 is a diagram schematically showing an entire construction of a nonvolatile semiconductor memory device according to Embodiment 1 of the present invention.

FIG. 4 is a block diagram schematically showing an entire construction of the nonvolatile semiconductor memory device according to Embodiment 1 of the present invention. In FIG. 4, the nonvolatile semiconductor memory device includes memory array blocks #1 to #n each having a plurality of nonvolatile memory cells arranged in rows and columns, row decoders XD1 to XDn provided corresponding to memory array blocks #1 to #n, respectively, and selection control line (SG) decoders/drivers SDD1 to SDDn.

Row decoders XD1 to XDn each have outputs arranged corresponding to the word lines (WL) of corresponding memory array blocks #1 to #n, to supply a voltage at a level according to an operation mode to the word line of a selected row. In the data reading mode, each of row decoders XD1 to XDn supplies the power supply voltage (Vdd) to the word line of a selected row. This power supply voltage Vdd is a power supply voltage supplied externally.

SG decoders/drivers SDD1 to SDDn have outputs corresponding to selection control lines SG (selection gate lines SGC, SGF) of respective memory array blocks #1 to #n, to supply a predetermined voltage to the selection gate line of the memory cells on a selected row according to the operation mode. SG decoders/drivers SDD1 to SDDn each include drive circuits for selection gate lines SGC and for selection gate lines SGF, to individually set potentials for selection gate lines SGC and SGF on a selected row and finally to boost a potential of lower layer gate electrode G2 of the selection transistor of the selected memory cell up to a target voltage level.

The nonvolatile semiconductor memory device further includes a column decoder YD that generates a column selection signal for selecting a column of memory array blocks #1 to #n, a column selecting circuit YS that is provided in common to memory array blocks #1 to #n and selects the bit line of the selected column according to the column selection signal from column decoder YD, and a sense amplifier/writing circuit AW that performs writing/reading of internal data on the bit line corresponding to a selected column selected by column selecting circuit YS.

Sense amplifier/writing circuit AW includes a sense amplifier that senses a current flowing in the bit line of the column selected by column selecting circuit YS at the time of reading data and a writing circuit that supplies writing data to the bit line of the selected column in the writing mode. The writing circuit includes, for example, a data latch circuit to latch the writing data and supply a voltage according to the latched data to a corresponding bit line on the selected column.

The nonvolatile semiconductor memory device further includes a peripheral circuit PH that reads and writes external data and generates necessary voltages internally, a pump circuit PUK that performs charge pump operation to generate internal voltages at predetermined levels, and a control circuit (sequencer) SQ that controls the writing, erasure, verification operation and data reading operation depending on various operation modes.

Peripheral circuit PH includes a power supply related circuit that generates voltages at various levels according to the operation mode, an input/output circuit that performs input and output of data/signal (IN, OUT) externally, a pump control circuit that detects the level of the internal voltages generated by pump circuit PUK and controls pump operation based on the detection result.

Pump circuit PUK includes a charge pump circuit that generates a voltage at a desired level utilizing the charge pump operation of a capacitance element, and performs the pump operation according a clock signal from an oscillation circuit included in peripheral circuit PH, to generate the internal voltages including positive voltages and negative voltages necessary for the various operation modes. These generated voltages are consumed in memory array blocks #1 to #n.

Control circuit (sequencer) SQ controls peripheral circuit PH according to the operation mode and selects a voltage at a required level from the voltages generated by the power supply related circuit to supply the selected voltage to row decoders XD1 to XDn and SG decoders/drivers SDD1 to SDDn. This control circuit SQ may be configured to activate only the charge pump circuit that generates a corresponding voltage according to the operation mode.

Figure 5:
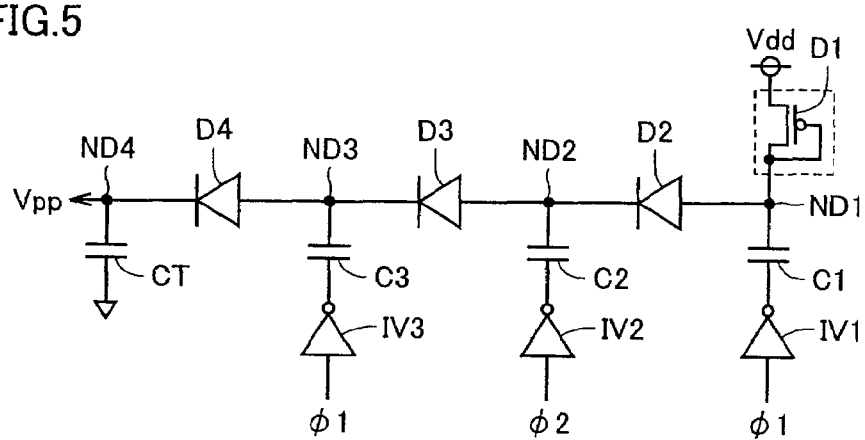
FIG. 5 is a diagram showing an example of a pump included in a pump circuit shown in FIG. 4.

FIG. 5 is a diagram showing an example of a construction of a portion for generating a high voltage Vpp, included in pump circuit PUK shown in FIG. 4. In FIG. 5, the charge pump for high voltage includes a diode element D1 connected between a power supply node and a node ND1, a diode element D2 connected between nodes ND1 and ND2, a diode element D3 connected between nodes ND2 and ND3, a diode element D4 connected between nodes ND3 and ND4, capacitance elements C1, C2 and C3 having first electrodes connected to nodes ND1, ND2 and ND3, respectively, inverters IV1 and IV3 that transmit an inversed clock signal to second electrodes of capacitance elements C1 and C3 in synchronization with a clock signal $\phi 1$, an inverter IV2 that inverts and transmits a clock signal $\phi 2$ to the second electrode of capacitance element C2, and a tank capacitance CT that stores electric charges of node ND4.

High voltage Vpp is outputted from node ND4. Clock signals $\phi 1$ and $\phi 2$ are non-overlapping, two phase clock signals, and are supplied from peripheral circuit PH shown in FIG. 4. By way of example, diode elements D1 to D4 are each formed of a p-channel MOS transistor (insulated gate field effect transistor) each having a gate and a drain interconnected with each other.

Figure 6:
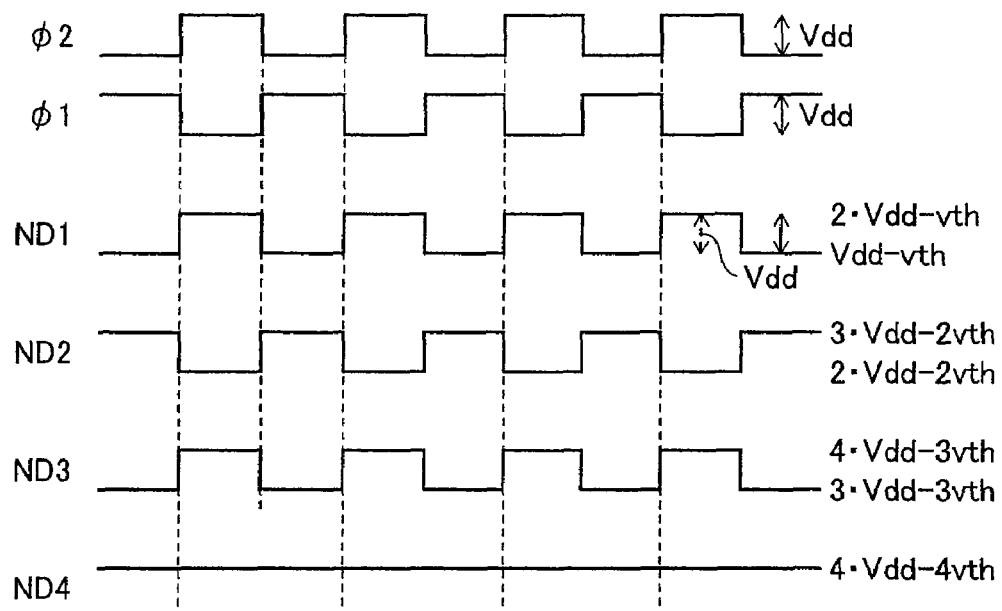
FIG. 6 is a timing diagram showing the operation of the pump shown in FIG. 5.

FIG. 6 is a timing chart representing an operation in a steady state of the charge pump for high voltage shown in FIG. 5. Referring to FIG. 6, the operation of the charge pump for high voltage shown in FIG. 5 will be briefly described. The amplitude of each of clock signals $\phi 1$ and $\phi 2$ is power supply voltage Vdd.

When clock signal $\phi 1$ falls from H level to L level, output signals of inverters IV1 and IV3 rise to H level. Concurrently, clock signal $\phi 2$ rises from L level to H level and an output signal of inverter IV2 turns L level. Node ND1 is precharged to a voltage Vdd-Vth by diode element D1. When the clock signal of inverter IV1 rises to H level in response to the fall of clock signal $\phi 1$, the voltage level of node ND1 rises up by Vdd to a voltage 2·Vdd-Vth level through the charge pumping operation of capacitance element C1. Here, Vth indicates a forward drop voltage (absolute value of the threshold voltage) of diode elements D1 to D4.

Similarly, an output signal of inverter IV3 rises to H level and the voltage level of node ND3 rises up by Vdd through the charge pumping operation of capacitance element C3.

At this time, since the output signal of inverter IV2 turns L level, the voltage level of node ND2 goes down. Due to the potential drop of node ND2, diode element D2 turns into an ON state and the voltage level of node ND2 attains a voltage 2·Vdd-2·Vth through charging operation from node ND1 (when a potential difference between nodes ND1 and ND2 becomes Vth through the movement of electric charges, diode D2 enters an OFF state; however, the operation in the steady state is considered here). The voltage level of node ND2 is not higher than that of node ND3 and diode element D3 is kept in an OFF state, so that the precharging of node ND2 is achieved.

When clock signal $\phi 1$ rises to H level and clock signal $\phi 2$ falls to L level, the output signals of inverters IV1 and IV3 turns L level and the output signal of inverter IV2 attains H level. Although the voltage level of node ND1 drops in response, the voltage level of node ND1 is clamped to the Vdd-Vth level by diode element D1. On the other hand, the voltage level of node ND2 goes up from the precharged voltage level by voltage Vdd level to a voltage level of 3·Vdd-2·Vth through the charge pump operation of capacitance element C2. When the voltage level of node ND3 goes down, electric charges are charged from node ND2 to node ND3 through diode element D3 to raise the voltage level thereat. Namely, the voltage level of node ND3 attains a lower voltage level by Vth than the voltage of node ND2, that is, a level of 3·Vdd-3·Vth. Accordingly, node ND3 changes between a voltage 4·Vdd-3·Vth and the voltage of 3·Vdd-3·Vth in accordance with clock signal $\phi 1$.

To node ND4 is connected only to tank capacitance CT for stabilizing the voltage and supplying charged electric charges, and the charging is performed through diode element D4. Accordingly, in this tank capacitance CT, the electric charges corresponding to the voltage level of a voltage 4·Vdd-4·Vth is accumulated according to the capacitance value of tank capacitance CT. Thus, high voltage Vpp can be generated at the level of the voltage 4·Vdd-4·Vth. For example, if power supply voltage Vdd is 3.3 V and forward drop voltage Vth is 0.8 V, then high voltage Vpp is (3.3−0.8)×4=10.0 V.

Accordingly, high voltage Vpp required in writing or erasure, for example, is generated using the charge pump as shown in FIG. 5 to accumulate the electric charges in tank capacitance CT. If a non-boosted power supply voltage can be utilized for memory cell selection in reading a memory cell, such a charge pump circuit is not required (if the read out voltage is 5.0 V, the voltage at node ND2 is utilized as the read out voltage supplied to the selection gate line), so that the occupying area of pump circuit PUK can be reduced.

In particular, pump circuit PUK is provided for memory array blocks #1 to #n and when the internal voltages are generated for these memory array blocks #1 to #n in common, the pump capacity of the pump circuit becomes large and in an actual circuit, pump efficiency is not 1 (unity), so that more pumping stages are required for the charge pump operation and the layout area thereof is increased.

Accordingly, by using the selection transistor, the threshold voltage of the memory transistor of the memory cell can be reduced, power supply voltage Vdd can be utilized for the read out voltage (word line read out voltage) supplied to the control gates of the memory cells, and the number of stages of pumps in pump circuit PUK can be reduced, so that the layout area can be reduced and further, the current consumption required for the pump operation can be reduced.

Furthermore, it is necessary to delay the memory cell selection operation until the pump voltage becomes stable and a waiting time before the starting of operation is necessary. In particular, in the construction in which the pump boosting voltage of pump circuit PUK is utilized for data reading, when the data is read successively and the voltage level of the pump boosting voltage lowers by the current consumption, the data reading needs to be performed intermittently (the charge pump operation cannot compensate for the quantity of electric charges consumed by the boosting operation on a selected word line), and thus, high speed data reading cannot be achieved. However, by utilizing the power supply voltage for the word line read out voltage, such intermittent operation of the reading and the wait time come to be unnecessary, which can achieves the high speed reading.

Further, in the memory cell, when the selection transistor is connected to the memory transistor in series, as large a memory cell current as possible needs to be driven for high speed reading. In this case, it is necessary that the selection transistor is required to have a small channel resistance a large current driving power. In order to make the current driving power of the selection transistor large, it can be considered to make the size (channel width) large. However, when the size of the selection transistor (channel width) is made large, the layout area of the memory cell increases and the effect of saving the area is impaired. Consequently, with selection gate lines SGC and SGF used as selection control line SG, the voltage level is set individually for each of gate electrodes G1 and G2 of the selection transistor without using the pump voltage of the charge pump (pump circuit PUK), and the gate potential of the selection transistor is boosted utilizing capacitive coupling between the gate electrodes, to increase the conductance. Now, this approach will be described.

Figure 7:
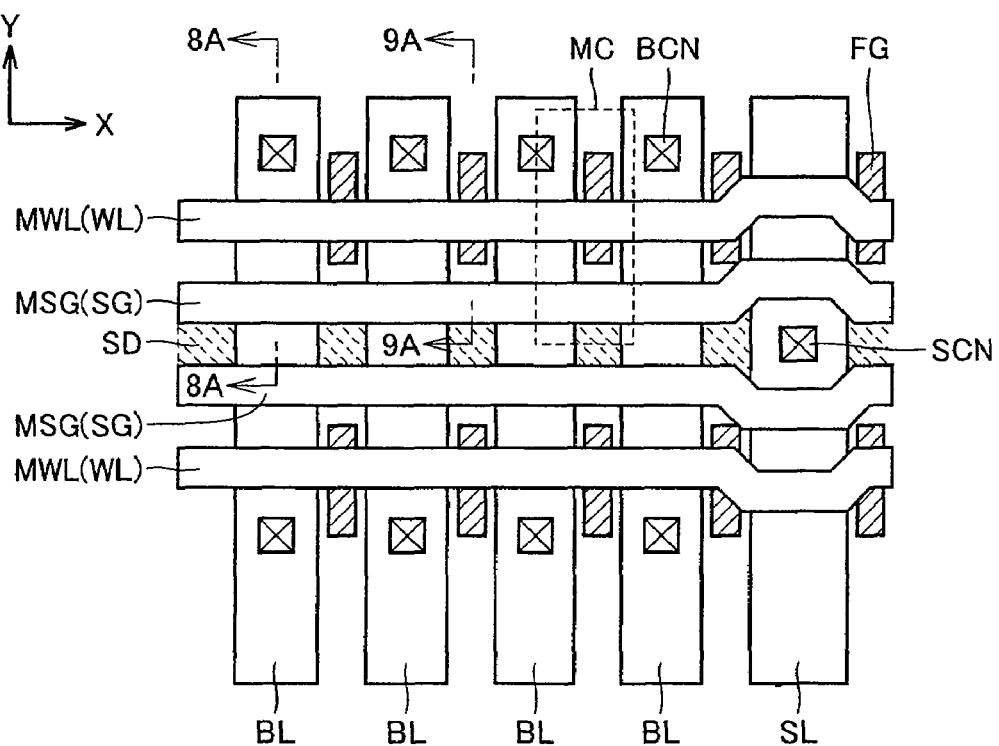
FIG. 7 is a diagram schematically showing a planar layout of the memory cells according to Embodiment 1 of the present invention.

FIG. 7 is a diagram schematically showing a planar layout of the memory cell array block according to Embodiment 1 of the present invention. In FIG. 7, a layout of memory cells MC of 8 bits is schematically shown. In FIG. 7, word lines WL are arranged extending in an direction X. Between these word lines WL, selection control lines SG are disposed extending in the X direction. Top layers of word line WL and selection control line SG are formed at a second metal interconnection layer. In FIG. 7, a metal word line MWL and a metal selection control line MSG are shown. A word line WL is formed of a polysilicon interconnection layer coupled to the control gates of the memory transistors and the metal word line MWL. Polysilicon interconnection layer and metal word line MWL are electrically shorted at predetermined intervals. With such a word line shunt structure, the electric resistance of word line WL is reduced equivalently to transmit the word line voltage at high speed.

Metal selection control line MSG is electrically shorted with first selection gate line SGC of the same layer as the word line polysilicon interconnection layer at predetermined intervals, for reducing the electric resistance of selection gate line SGC, similarly to the word line. As for second selection gate line SGF, the metal interconnection of the upper layer is not disposed and the shunt structure is not applied.

Bit lines BL formed of first level metal interconnection line are disposed in a direction Y corresponding to the respective columns of memory cells MC. Source lines SL are disposed in parallel to bit lines BL, continuously extending in the Y direction. Source impurity diffusion layer SD is formed continuously on the substrate region surface between selection control lines SG (selection gate line SGC and SGF) and source impurity diffusion layer SD is coupled to source line SL through a source contact SCN.

In a region between bit lines BL, floating gate FG in a rectangular shape extending in the direction Y is arranged so as to intersect with word line WL. A bit line contact BCL is formed in each of bit lines BL neighboring to one end of floating gate FG, and the impurity diffusion region (drain impurity region) in the vicinity of this floating gate is connected to corresponding bit line BL through bit line contact BCN.

Metal word line MWL and metal selection control line MSG are the second level metal interconnection lines and are arranged in a direction intersecting with bit line BL and source line SL formed of the first level metal interconnection line. In order to ensure the region of source contact SCN, each of word line WL (MWL) and selection control line SG (MSG) has an interconnection layout position thereof shifted in a region where it crosses with source line SL such that the layout forms a convex shape.

Memory cell MC is arranged mirror-symmetrically and in parallel with respect to selection control line SG. Memory cell MC is, thus, formed by a region surrounding bit line contact BCN, floating gate FG, and source impurity diffusion layer SD.

In the memory cell array block, by repeating the layout shown in FIG. 7 in the X direction and by repeating the layout inverted mirror-symmetrically in the direction Y to provide the layout of the memory cells in the memory cell array block.

Figure 8:
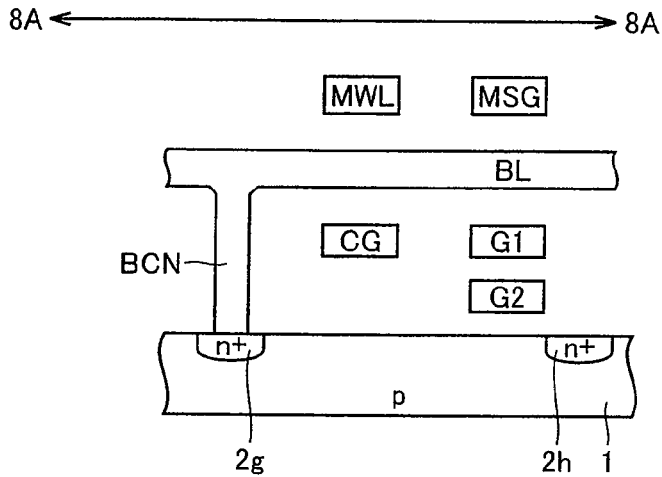
FIG. 8 is a diagram schematically showing a cross-sectional structure taken along line 8A-8A shown in FIG. 7.

FIG. 8 is a diagram schematically showing a cross-sectional structure taken along line 8A-8A shown in FIG. 7. In FIG. 8, on the p-type substrate region 1 surface, impurity regions 2g and 2h are formed apart from each other. Impurity region 2g is coupled to bit line BL through bit line contact BCN. In a region between impurity regions 2g and 2h under bit line BL, control gate electrode CG of the memory transistor is formed, and selection gate electrodes G1 and G2 of the selection transistor are formed. These control gate electrode CG and upper layer gate electrode G1 are formed of the interconnection lines of the same layer. Lower layer gate electrode G2 is formed in alignment with and under upper layer gate electrode G1, and is formed of the interconnection line of the same interconnection layer as the floating gate not shown in FIG. 8.

In the region between impurity regions 2g and 2h on the p-type semiconductor substrate region 1 surface, a field insulating film (not shown) or the like is formed, and at the p-type semiconductor substrate region 1 surface along the extending direction of this bit line BL, impurity regions 2g and 2h are isolated.

Above bit line BL, metal word line MWL is arranged in alignment with control gate electrode CG, and metal selection control line MSG is formed of interconnection line of the same interconnection layer as metal word line MWL and in alignment with gate electrode layers G11 and G2. Metal word line MWL is electrically connected to control gate electrode CG at predetermined intervals in a region not shown in the figure. Furthermore, metal selection control line MSG is, similarly to metal word line MWL, electrically connected to upper layer gate electrode G1 in a region not shown in the figure. Lower layer gate electrode G2 is electrically connected to another conductive layer in a region not shown in the figure, and different voltage control is performed on these gate electrode layers G1 and G2.

Figure 9:
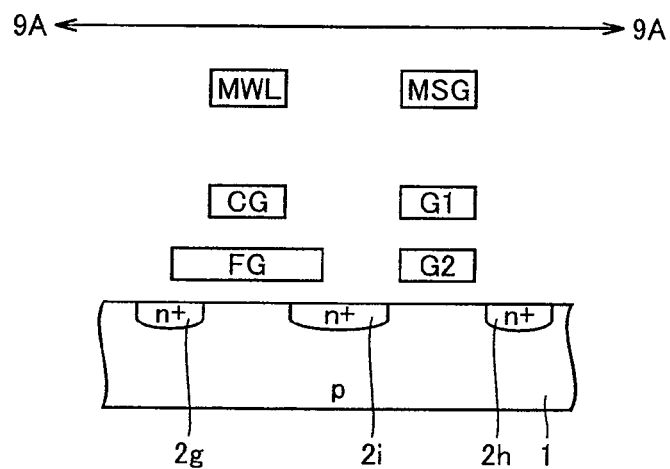
FIG. 9 is diagram schematically showing a cross-sectional structure taken along line 9A-9A shown in FIG. 7.

FIG. 9 is a diagram schematically showing a cross-sectional structure taken along line 9A-9A shown in FIG. 7. In FIG. 9, on the p-type substrate region 1 surface, impurity regions 2g, 2i and 2h are formed apart from one another. Above a region between impurity regions 2g and 2i, floating gate FG is formed. Floating gate FG is formed having regions overlapping with impurity regions 2g and 2i. Control gate electrode CG is formed above floating gate FG. Above control gate electrode CG, metal word line MWL is formed in alignment with control gate electrode CG.

Above a region between impurity regions 2i and 2h, gate electrodes G2 and G11 are formed, and above these gate electrodes G1 and G2, metal selection control line MSG is arranged in alignment with gate electrodes G1 and G2.

As shown in FIGS. 7 to 9, the selection transistor can be formed in the same manufacturing steps as those of the memory cell transistor. In FIGS. 8 and 9, impurity region 2h corresponds to source impurity diffusion layer 2c shown in FIG. 2 and source impurity diffusion layer SD shown in FIG. 7.

This floating gate FG is formed overlapping with impurity regions 2g and 2i formed thereunder. In this case, such a structure may be employed, in which floating gate FG is formed of undoped polysilicon and impurity of high concentration is implanted into only the region overlapping with the control gate electrode CG, to form a low resistance region. In this structure, the regions overlapping with impurity regions 2g and 2i are in a high resistance state, and parasitic capacitance in the overlapping regions of impurity regions 2g and 2i and floating gate FG is reduced. Floating gate FG may be formed of doped polysilicon. In this structure, selection gate line SGF connected to lower layer gate electrode G2 can have low resistance and the voltage of selection gate line SGF can be changed at high speed. In either structure, lower layer gate electrode G2 and selection gate line SGF are formed in the same step as a step of forming floating gate FG.

Figure 10:
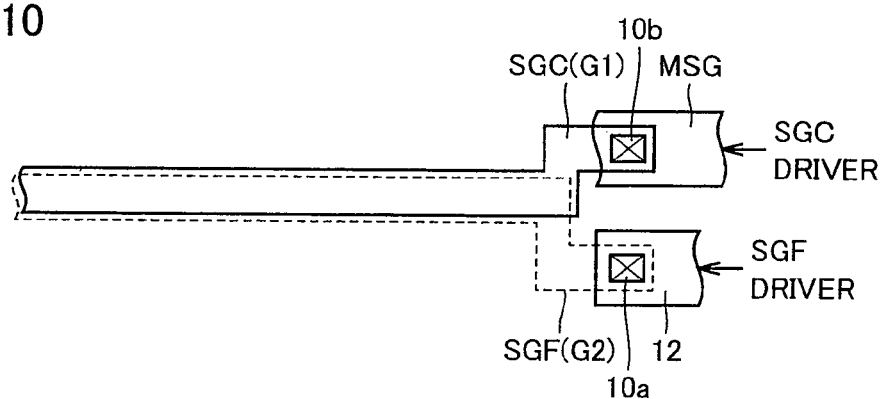
FIG. 10 is diagram schematically showing a layout of an end portion of a selection gate line shown in FIG. 7.

FIG. 10 is a diagram schematically showing a layout of an end portion of selection gate lines SGF and SGC to which gate electrodes G1 and G2 shown in FIGS. 7 to 9 are coupled. By selection gate line SGF, lower layer gate electrodes G2 of the memory cells arranged in one row along the direction X are connected in common (lower layer gate electrode G2 and selection gate line SGF are the common interconnection line). Above selection gate line SGF, second selection gate line SGC for coupling with upper layer gate electrode G1 is formed (upper layer gate electrode G1 and selection gate line SGC are the common interconnection line). Upper layer gate electrodes G2 of the memory cells arranged in one row along the direction X are connected to selection gate line SGC.

In the end portion, selection gate line SGF is coupled to an upper layer metal interconnection line 12 through a contact 10a. Selection gate line SGC is coupled to metal selection control line MSG through a contact 10b. Output of an SGF driver included in SG decoder/driver shown in FIG. 4 is coupled to this metal interconnection line 12 and metal selection control line MSG is, similarly, coupled to an SGC driver included in SG decoder/driver.

SGC driver and SGF driver are arranged corresponding to each row of the memory cells aligned in the X direction. Thereby, the potentials of control gate lines SGC and SGF are individually controlled for each row.

Though not shown in the figure, metal selection control line MSG is electrically contacted with selection gate line SGC at predetermined intervals, to equivalently reduce electric resistance of selection gate line SGC to change its potential at high speed. Control gate line SGF is coupled to metal interconnection line 12 at the end portion. In second selection gate line SGF, high speed voltage driving is not particularly required, and, even if selection gate line SGF is not formed into the shunt structure, selection gate SGF is subjected to the impurity injection in the same step as the step of impurity injection for reducing the resistance of floating gate FG, and has a reduced resistance value, and therefore it can change the potential at relatively high speed.

Figure 11:
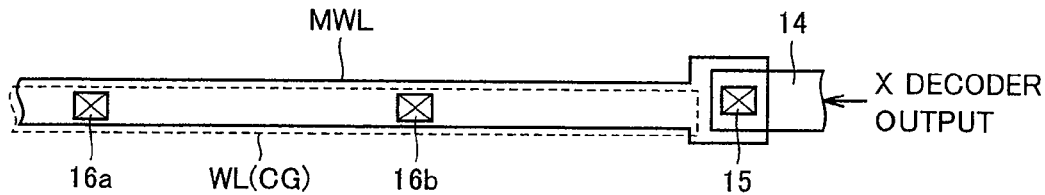
FIG. 11 is a diagram schematically showing a planar layout of a word line shown in FIG. 7.

FIG. 11 is a diagram schematically showing a layout of an end portion of metal word line MWL and word line WL (control gate electrode CG). Metal word line MWL is coupled to a conductive layer 14 that transmits an X decoder output signal through a contact 15 at the end portion. Metal word line MWL is electrically connected to word line WL formed thereunder through contacts 16a, 16b. Control gate electrode CG of the memory transistor is coupled to word line WL (they are formed by the same interconnection line).

In FIG. 11, the end portion of word line WL connecting to control gate electrodes CG is shown not receiving the output signal of X decoder. However, word line WL is similarly coupled to conductive layer 14 through a contact (or a wire) at the end portion to receive the output of the X decoder, so that both of metal word line MWL and word line WL are driven by the output of the X decoder from the end portion.

Figure 12:
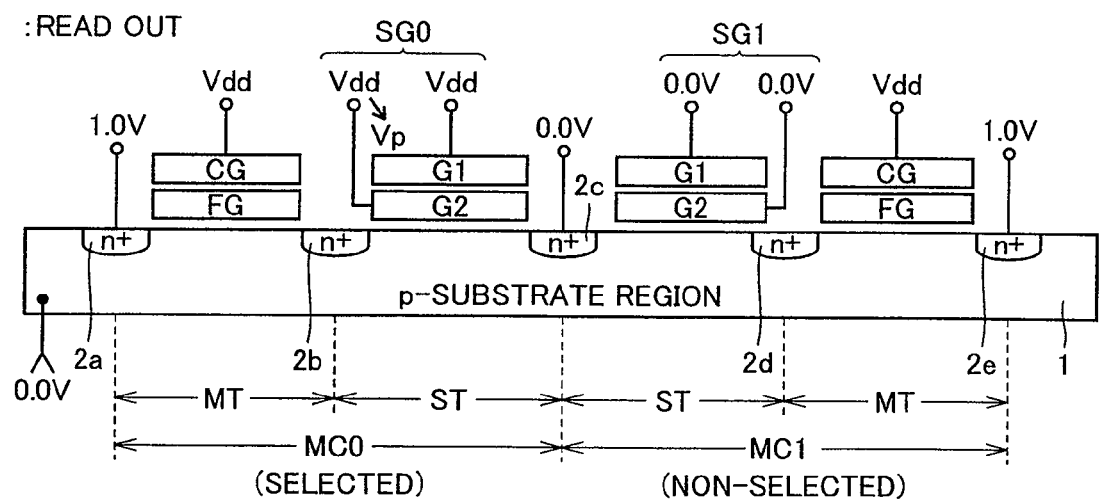
FIG. 12 is a diagram showing voltages applied to the memory cells in reading data in Embodiment 1 of the present invention.

FIG. 12 is a diagram showing an example of applied voltages of memory cells MC0 and MC1 in reading data. In FIG. 12, memory cell MC0 is selected, and memory cell MC1 is in a non-selected state. These memory cells MC0 and MC1 share the bit line and in reading data, a bit line read out voltage of 1.0V is supplied to impurity regions 2a and 2e connected to the bit line. Power supply voltage Vdd is supplied to control gate electrodes CG of memory cells MC0 and MC1 as the word line read out voltage in reading data.

A ground voltage of 0.0 V is applied to impurity region 2c through the source line. In selected memory cell MC0, power supply voltage Vdd is supplied to upper layer gate electrode G1 and lower layer gate electrode G2 at different timings from each other in the selection control line SG0, and selection transistor ST enter a conductive state. In memory cell MC1, gate electrodes G1 and G2 are both set to the ground voltage 0.0 V and selection transistor ST is kept in a non-conductive state. Accordingly, even when impurity region 2c is connected through the common source diffusion layer and impurity regions 2a and 2e are connected to the common bit line and supplied a bit line reading voltage (1.0 V), selection transistor ST of memory cell MC0 is in an ON state and selection transistor ST of memory cell MC1 is in an OFF state, so that a current according to stored information of memory cell transistor MT of selected memory cell MC0 flows from impurity region 2a to impurity region 2c.

In reading data, simply, power supply voltage Vdd is supplied to all the word lines. The threshold value of each of memory cells MC0 and MC1 is set according to accumulated electric charges of floating gate FG. In the threshold voltage distribution, power supply voltage Vdd is utilized as a state discriminating criterion voltage, and the threshold voltage of memory cell transistor MT is low in either of the programmed state and the erasure state. Furthermore, even if memory transistor MT of non-selected memory cell MC1 is in an over-erased state, selection transistor ST of non-selected memory cell MC1 is in a non-conductive state, and the path through which a current flows between impurity regions 2c and 2e is surely shut off, so that the influence of leakage current of this memory cell transistor MT in the over-erased state can be eliminated and precise data reading can be achieved.

Only power supply voltage Vdd is supplied to control gate electrode CG and no boosted voltage is used, and thus the consumption current can be reduced in reading data. Furthermore, regardless of selection/non-selection of the memory cell, the word line read out voltage is applied to all the memory cells in common, and thus, it becomes unnecessary to perform charging and discharging of the word line for each memory cell selection, but it is only necessary to perform charging and discharging of the gate potential of the selection transistor of a selected memory cell, suppressing an increase in consumption current.

As for selection transistor ST, in memory cell MC0, power supply voltage Vdd is supplied to upper layer gate electrode G1. On the other hand, lower layer gate electrode G2 is first supplied with power supply voltage Vdd, and then is put into a floating state. The boosting operation is performed through capacitive coupling between gate electrodes G1 and G2 to boost the potential of gate electrode G2 to a high voltage Vp. Thereby, in memory cell MC0, a control electrode potential of selection transistor ST can be made high, a channel conductance can be made large, and current driving power can be made large. Further, this allows a current to flow at high speed between impurity regions 2a and 2c and a bit line read out current to be discharged at high speed between the bit line and the source line, achieving high speed data reading.

For a sense circuit in reading data, either of a voltage sense amplifier that detects change in bit line potential and current sense type sense amplifier that detects current change of the bit line may be used.

Figure 13:
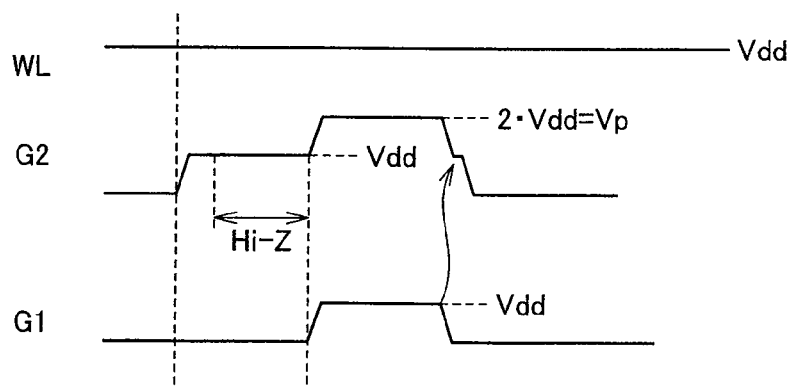
FIG. 13 is a diagram showing potential changes of the selection gate of the memory cell at the time of applying the voltages as shown in FIG. 12.

FIG. 13 is a diagram schematically showing voltage changes over time in gate electrodes G1 and G2 of selection control line SG0 of the selected memory cell shown in FIG. 12.

In reading data, word line WL is kept at the power supply voltage Vdd level. Also, in reading data, lower layer gate electrode G2 of selection transistor of a selected memory cell is charged to the power supply voltage Vdd level according to an address signal under the control of the sequencer (according to the output of SGF driver of FIG. 10). When lower layer gate electrode G2 is set to and stabilized at power supply voltage Vdd level by selection gate line SGF shown in FIG. 10, selection gate line SGF shown in FIG. 10 is kept in a floating state (high impedance state Hi-Z).

Subsequently, upper layer gate electrode G1 is driven to power supply voltage Vdd level through selection gate line SGC according to an output signal of SGC driver shown in FIG. 10. Gate electrodes G1 and G2 are continuously and integrally formed with gate lines SGC and SGF, respectively, and the capacitive coupling between them raises the voltage level of gate electrode G2 in the floating state by voltage Vdd to a voltage level of 2·Vdd. Accordingly, in memory cell MC0, the gate voltage of selection transistor ST becomes at the high voltage Vp level. In this case, the capacitive coupling between gate electrodes G1 and G2 (selection gate lines SGC and SGF) is merely used, and the used voltage is only power supply voltage Vdd. Accordingly, since no charge pump for boosting is utilized, the gate potential of the selection transistor of the selected memory cell can be boosted with a low current consumption. The bit line current change can be caused according to stored data of the selected memory cell at high speed.

With the boosting construction of the gate voltage, the size (channel width) of selection transistor ST need not be increased, and thus, an increase in memory cell size can be suppressed.

Furthermore, since power supply voltage Vdd is simply utilized, it is not necessary to stand by for the time period required for generating the boosting voltage by a charge pump for reading data, and high speed reading is achieved.

Figure 14:
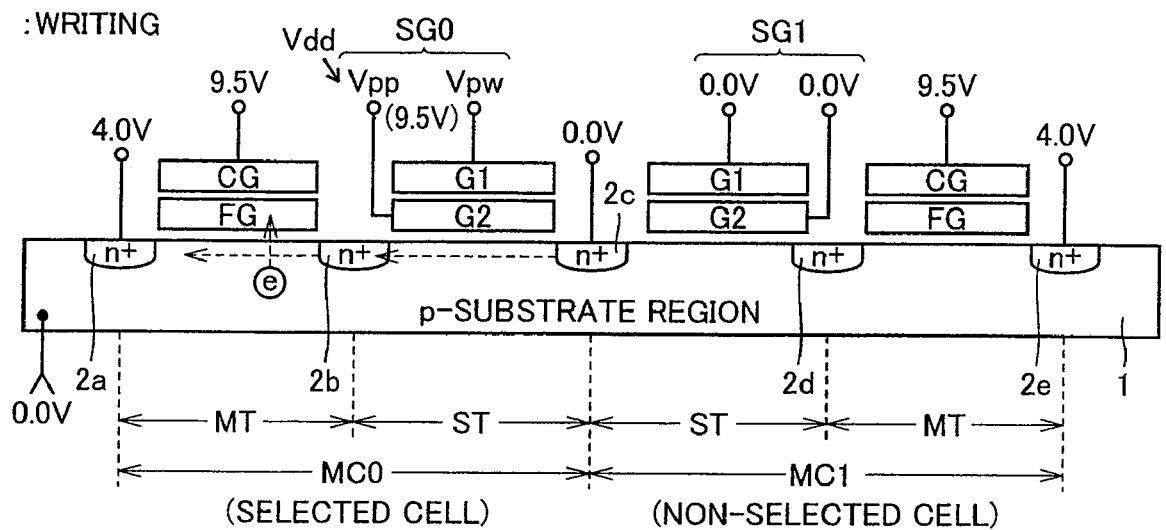
FIG. 14 is a diagram showing voltages applied to the memory cells in writing data according to Embodiment 1 of the present invention.

FIG. 14 is a diagram showing voltages applied to memory cells MC0 and MC1 in writing data (injection of electrons into the floating gate). In FIG. 14, when memory cell MC0 is a selected memory cell, a bit line writing voltage of 4.0 V is supplied to impurity region 2a through the bit line. A high voltage of 9.5 V is supplied to control gate electrode CG through the word line. In selection transistor ST of memory cell MC0, lower layer gate electrode G2 is finally boosted to a high voltage Vpp level of about 9.5 V. Also in this case, the voltage level of lower layer gate electrode G2 is boosted from a lower voltage level such as voltage Vdd in accordance with a word line writing voltage Vpw applied to upper layer gate electrode G1. Impurity region 2c is kept at the ground voltage level through the source line.

Memory cell MC1 is a non-selected memory cell. The ground voltage (0.0 V) is supplied to gate electrodes G1 and G2. A high voltage of 9.5 V is supplied to control gate electrode CG and the bit line writing voltage (4.0 V) is similarly supplied to impurity region 2e through the bit line.

Substrate region 1 is kept at the ground voltage level. In memory cell MC0, control gate electrode CG of memory transistor MT is at the high voltage of 9.5 V and forms the channel. In memory cell MC0, selection transistor ST is made conductive, a current flows from impurity region 2a to impurity region 2c according to the bit line writing voltage of 4.0 V. In the current flowing through memory cell transistor MT and selection transistor ST, channel hot electrons, e, are generated and accelerated by the high voltage supplied to control gate electrode CG to be injected into floating gate FG.

In the non-selected memory cell MC1, selection transistor ST is in a non-conductive state, and even when memory cell transistor MT is in an ON state, the path through which a current flows through impurity region 2d is shut off, so that the channel hot electrons are not generated and the injection of the electrons into floating gate FG is not performed. Thereby, the writing of data to selected memory cell MC0 can be performed, while in non-selected memory cell MC1, the injection of the electrons into floating gate FG can be prohibited.

Figure 15:
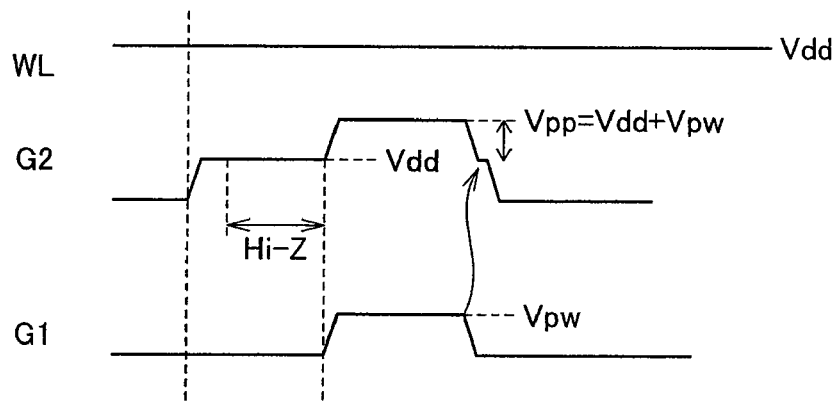
FIG. 15 is a diagram showing changes in electrode potential of the selected memory cell in a voltage applied state as shown in FIG. 14.

FIG. 15 is a diagram schematically showing a sequence of a voltage application to gate electrodes G1 and G2 of selection transistor ST of selected memory cell MC0 shown in FIG. 14.

First, in writing data, power supply voltage Vdd is supplied to lower layer gate electrode G2. When the voltage level becomes stable at the power supply voltage Vdd level, lower layer gate electrode G2 is kept in a floating state (high impedance state Hi-Z). Then, the voltage level of upper layer gate electrode G1 is driven to the high voltage Vpw level. This voltage rise of gate electrode G1 raises the voltage level of gate electrode G2 in the floating state by Vpw to the high voltage Vpp level through capacitive coupling between gate electrodes G1 and G2. This high voltage Vpp is Vdd+Vpw. When the writing is completed, gate electrode G2 is driven to the ground voltage level together with voltage drop of upper layer gate electrode G1. The voltage driving of gate electrodes G1 and G2 is performed by SGC driver and SGF driver, as shown in FIG. 10.

As shown in FIG. 15, the boosting circuit is required to generate high voltage Vpw for upper layer gate electrode G1. However, voltage Vpw is a voltage level lower than final high voltage Vpp. Accordingly, as compared with a state in which high voltage Vpp (for example, about 9.5 V) is generated using a charge pump, it is only required to generate high voltage Vpw, such as a voltage of 6.0 V (in the case where power supply voltage Vdd is about 3.5 V) through the charge pump operation, so that the number of circuit stages of the charge pump circuit can be reduced and the occupying area and the current consumption can be reduced.

In selected memory cell MC0, as for lower layer gate electrode G2 of selection transistor ST, the gate electrode g2 may be finally set to the high voltage Vpp by driving the upper layer gate electrode G1 to the voltage level of Vpp/2 after lower layer gate electrode G2 is precharged to a voltage level of a voltage Vpp/2. When power supply voltage Vdd is lower than the voltage of Vpp/2, the voltage level used for gate driving of the selection transistor can be made lower (because Vpw>Vpp/2), and thus, the current consumption and the layout area of the boosting circuit can be reduced.

When writing is performed using an F-N (Fowler-Nordheim) tunneling current with substrate region 1, in the non-selected memory cell, the voltage of control gate electrode CG is kept at the power supply voltage level or at ground voltage level. A negative voltage of about −9.5 V is supplied to impurity regions 2a and 2e coupled to the bit line and a negative voltage of about −9.5 V is also supplied to substrate region 1. Thereby, a high electric field is applied to floating gate FG and electrons can be injected into floating gate FG of selected memory cell MC0 from the substrate region 1 by Fowler-Nordheim tunneling current. In the non-selected memory cell, since the voltage of control gate electrode CG is at power supply voltage Vdd or ground voltage level and the electric field applied to floating gate FG is lower than the intensity causing the tunneling phenomenon, the tunneling current is not generated, and thus, writing is not performed. In the case where the FN tunneling current from the substrate region is utilized, the selection transistor is connected to the source line side, and thus, selection transistor ST can be kept in a non-conductive state, and there is no current consumption for selection transistor driving, and accordingly the current consumption can be reduced.

Figure 16:
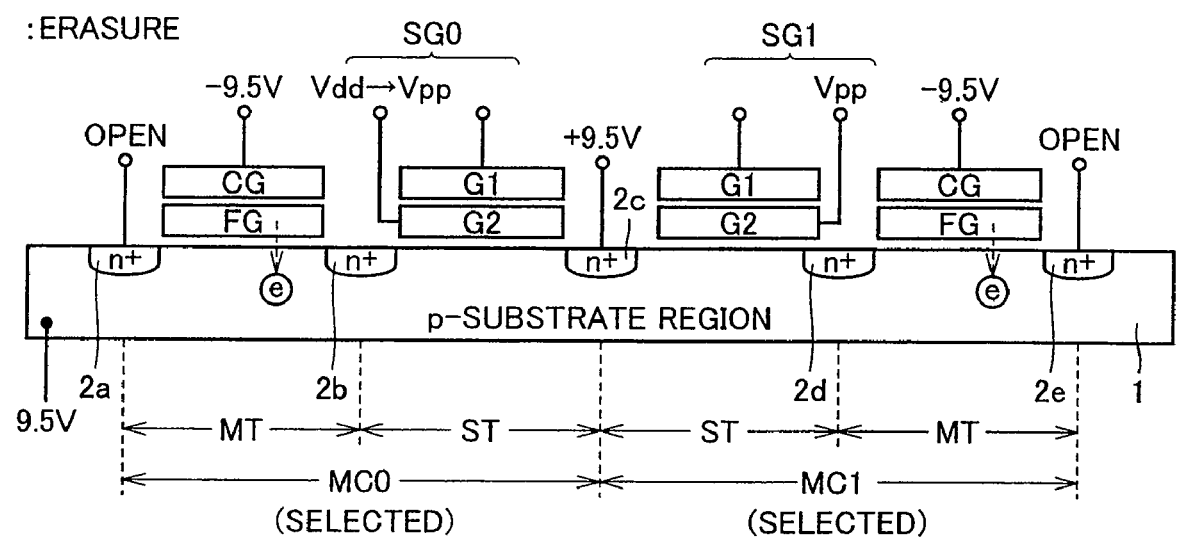
FIG. 16 is a diagram showing an example of voltages applied to the memory cells in erasure in Embodiment 1 of the present invention.

FIG. 16 is a diagram showing the voltages applied to memory cells MC0 and MC1 in erasure operation. In erasure operation, the erasure operation is performed simultaneously on memory cells MC0 and MC1. Specifically, flash (collective) erasure is executed on the memory cells (a sector) formed on p-type semiconductor substrate region 1. In the erasure, impurity regions 2a and 2e connected to the bit line are kept in an open (floating) state. A negative voltage of −9.5 V is supplied to impurity region 2c through the source line. In both of memory cells MC0 and MC1, a negative voltage of −9.5 V is supplied to control gate electrode CG. Lower layer gate electrode G2 is set to high voltage Vpp level. P-type substrate region 1 is kept at a high voltage of 9.5 V (Vpp level).

Even if p-type substrate region 1 is kept at the positive high voltage level of 9.5 V, impurity region 2c connected to the source line is kept at the voltage level of 9.5 V and impurity regions 2a and 2e are in the open state, so that there exists no path through which a current flows from substrate region 1 through impurity regions 2a to 2e.

The high voltage of 9.5 V applied to impurity region 2c is supplied to impurity regions 2b and 2d through selection transistors ST of memory cells MC0 and MC1, respectively. In each of memory cells MC0 and MC1, a high electric field is developed between control gate CG and substrate region 1, electrons, e, accumulated in floating gate FG are released to substrate region 1 by FN tunneling current, and the electrons are released to the source line through impurity region 2b and 2d and through the channel region under selection transistor ST.

In erasure time, the potential of lower layer gate electrode G2 of selection transistor ST is driven over two steps to be driven from power supply voltage Vdd to high voltage Vpp level or from voltage Vpp/2 to high voltage Vpp, and thus, it is not required to generate high voltage Vpp with a charge pump circuit for transmitting the generated high voltage to the memory cells. Thus, the current consumption for generating the boosted voltage used in an erasure operation can be reduced.

Figure 17:
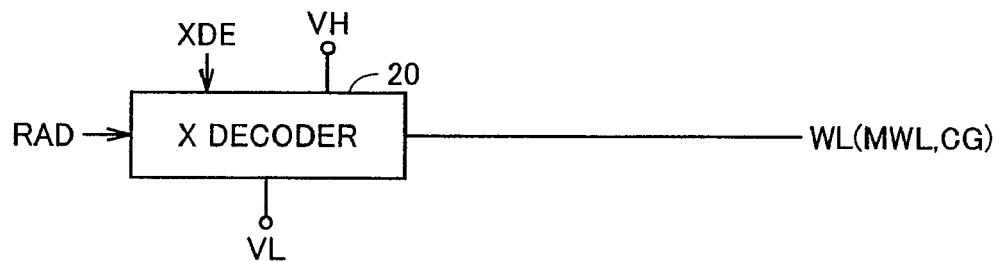
FIG. 17 is a diagram schematically showing a construction of an X decoder for driving a word line used in the nonvolatile semiconductor memory device according to the present invention.

FIG. 17 is a diagram schematically showing a construction of a portion driving word line WL (MWL, CG). Word line WL is driven by an X decoder 20 receiving a row address signal RAD. X decoder 20 is included in each of row decoders XD1 to XDn shown in FIG. 4 and is provided for each word line. X decoder 20 is activated in response to an activation of a row decoder enable signal XDE to drive a corresponding word line WL according to voltages applied to a high-side power supply node VH and a low-side power supply node VL.

Figure 18:
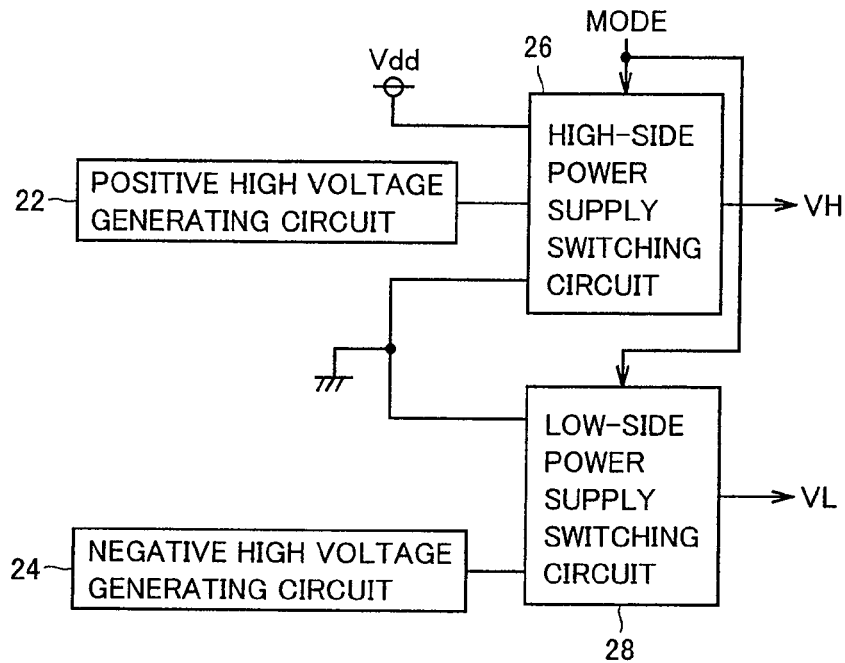
FIG. 18 is a diagram schematically showing a construction of a portion generating voltages for driving the word line shown in FIG. 17.

FIG. 18 is a diagram showing an example of a construction of a portion supplying the voltages applied to X decoder 20 shown in FIG. 17. In FIG. 18, a word line voltage supplying portion includes a positive high voltage generating circuit 22 that generates a positive high voltage, for example, of 9.5 V, a negative high voltage generating circuit 24 that generates a negative high voltage, for example, of −9.5 V, a high-side power supply switching circuit 26 that selects one of power supply voltage Vdd, an output voltage of positive high voltage generating circuit 22 and the ground voltage according to an operation mode instruction signal MODE to supply the selected one to X decoder high-side power supply node VH, and a low-side power supply switching circuit 28 that selects one of an output voltage of negative high voltage generating circuit 24 and the ground voltage according to the operation mode instruction signal MODE to supply the selected one to X decoder low-side power supply node VL.

Operation mode instruction signal MODE is a signal of a plurality of bits and specifies writing, erasure, and reading modes. This signal is generated by the control circuit (sequencer) shown in FIG. 4, based on an externally applied command specifying an operation mode. Row address signal RAD is generated according to an external address signal.

High-side power supply switching circuit 26, in the data reading mode, selects and supplies power supply voltage Vdd to high-side power supply node VH. In the writing mode, high-side power supply switching circuit 26 selects a positive high voltage, for example of 9.5 V generated by positive high voltage generating circuit 22, for supply to high-side power supply node VH. In the erasure mode, high-side power supply switching circuit 26 selects and supplies the ground voltage to high-side power supply node VH. In the erasure mode, the negative high voltage (for example, −9.5 V) is supplied to a selected word line. In this operation, low-side power supply switching circuit 28 selects a negative high voltage generated by negative high voltage generating circuit 24 for supply to low-side power supply node VL. In the writing and reading modes, low-side power supply switching circuit 28 selects the ground voltage. Thus, in X decoder 20, in the erasure mode, high-side power supply node VH is set to the ground voltage level and low-side power supply node VL is set to the negative high voltage level.

Positive high voltage generating circuit 22 and negative high voltage generating circuit 24 shown in FIG. 18 include charge pumps for generating the positive voltage and the negative voltage which are included in pump circuit PUK shown in FIG. 4, respectively, and high-side power supply switching circuit 26 and low-side power supply switching circuit 28 are included in peripheral circuit PH shown in FIG. 4. Both of the positive voltage and the negative voltage are generated through the boosting operation by the charge pump circuits.

Figure 19:
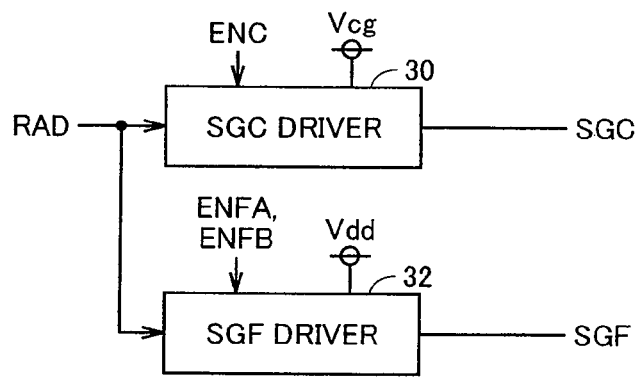
FIG. 19 is a diagram schematically showing a construction of a selection gate line driving unit in Embodiment 1 of the present invention.

FIG. 19 is a diagram schematically showing an example of a construction of a portion of driving selection gate lines SGC and SGF. In FIG. 19, a selection gate line driving portion includes an SGC driver 30 that drives selection gate line SGC according to row address signal RAD, and an SGF driver 32 that drives selection gate line SGF according to row address signal RAD. These SGC driver 30 and SGF driver 32 are included in each of SG decoders/drivers SDD1 to SDDn shown in FIG. 4 and are provided corresponding to the respective selection control lines SG (selection gate line SGC, SGF).

SGC driver 30 is activated in response to an activation of an enable signal ENC to transmit a selection gate voltage Vcg to corresponding selection gate line SGC. SGF driver 32 transmits power supply voltage Vdd to corresponding selection gate line SGF according to two activation signals ENFA and ENFB. SGF driver 32 is activated in response to an activation of activation signal ENFA to supply power supply voltage Vdd to selection gate line SGF, and enters an output high impedance state when activation signal ENFB is activated.

Figure 20:
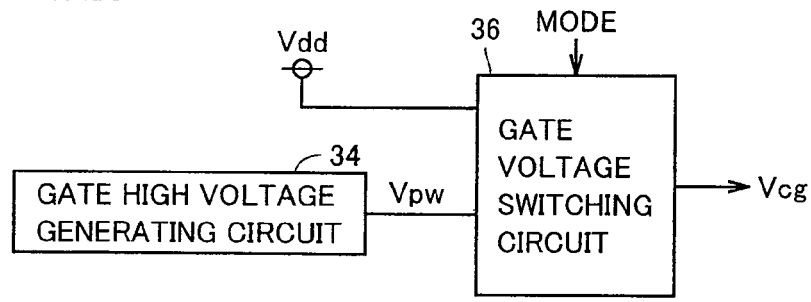
FIG. 20 is a diagram schematically showing a construction of a portion generating a selection gate voltage shown in FIG. 19.

FIG. 20 is a diagram schematically showing an example of a construction of a portion generating selection gate voltage Vcg applied to SGC driver 30. In FIG. 20, a selection gate voltage generating portion includes a gate high voltage generating circuit 34 that generates gate high voltage Vpw and a gate voltage switching circuit 36 that selects one of power supply voltage Vdd and gate high voltage Vpw according to operation mode instruction signal MODE to output the selected one as selection gate voltage Vcg.

Gate high voltage generating circuit 34 includes a charge pump included in pump circuit PUK shown in FIG. 4 and additionally includes a construction, such as a voltage detecting circuit, for detecting the voltage level of the charge pump. Gate voltage switching circuit 36 is included in peripheral circuit PH shown in FIG. 4 and the voltage level of this selection gate voltage Vcg is switched according to operation mode instruction signal MODE.

Figure 21:
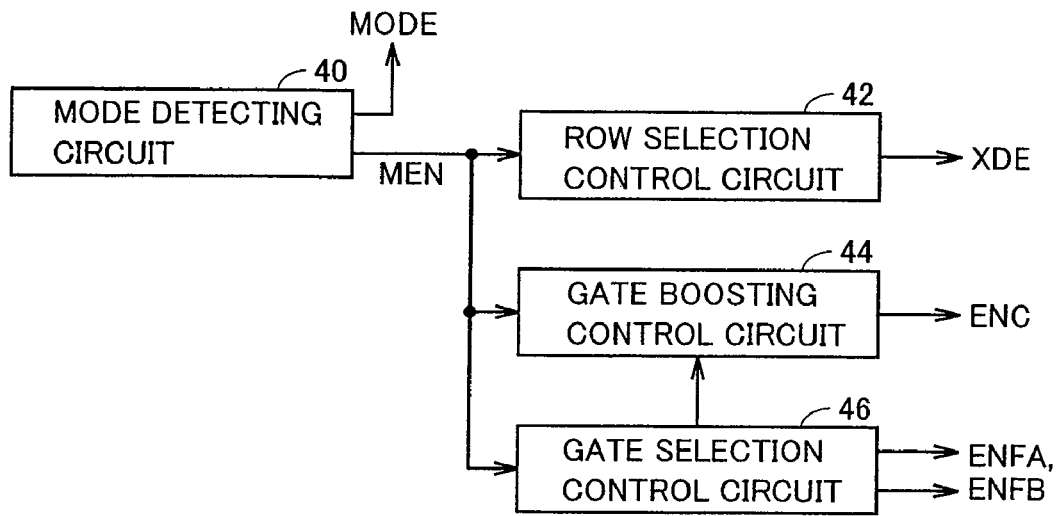
FIG. 21 is a diagram showing one example of a construction of a portion generating control signals shown in FIGS. 19 and 20.

FIG. 21 is a diagram schematically showing an example of a construction of a row circuitry driving portion that generates control signals MODE, XDE, ENC, ENFA and ENFB shown in FIGS. 17 and 20. In FIG. 21, the row circuitry driving portion includes a mode detecting circuit 40 that detects an operation mode according to an externally applied command, a row selection control circuit 42 that generates row decoder enable signal XDE according to a main enable signal MEN from mode detecting circuit 40, a gate boosting control circuit 44 that generates the selection gate enable signal ENC according to main enable signal MEN, and a gate selection control circuit 46 that generates the activation signals ENFA and ENFB according to main enable signal MEN.

Operation mode instruction signal MODE is also outputted from mode detecting circuit 40. Mode detecting circuit 40 is included in control circuit (sequencer) SQ shown in FIG. 4, and row selection control circuit 42, gate boosting control circuit 44 and gate selection control circuit 46 are included in peripheral circuit PH shown in FIG. 4.

Figure 22:
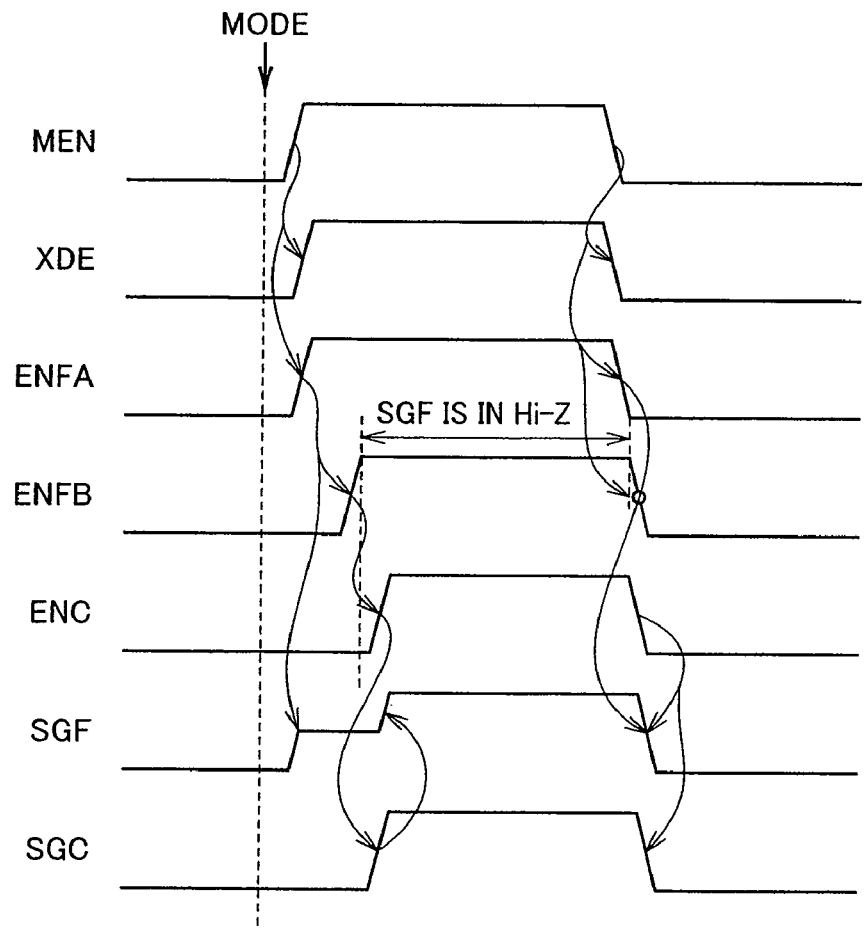
FIG. 22 is a timing diagram representing an operation of the circuits shown in FIGS. 19 to 21.

FIG. 22 is a timing chart showing an operation of the row driving portion shown in FIG. 21. In FIG. 22, voltage changes of selection gate lines SGF and SGC are also shown. In FIG. 22, each of the control signals is shown being a positive logic signal and attaining H level when in active state, by way of example.

Detecting circuit 40 detects an operation mode according to the external command, and sets operation mode instruction signal MODE to a state instructing the operation mode specified by the external command, and activates main enable signal MEN. In response to the activation of main enable signal MEN, row selection control circuit 42 is activated to drive row decoder enable signal XDE to an active state (H level). Gate selection control circuit 46 activates selection gate activation signal ENFA according to the activation of main enable signal MEN. In response to the activation of selection gate activation signal ENFA, SGF driver shown in FIG. 19 is activated to transmit power supply voltage Vdd to selection gate line SGF. When the voltage level of selection gate line SGF attains a definite state, then, gate selection control circuit 46 activates selection gate activation signal ENFB, or drives it to H level. When these selection gate activation signal ENFA and ENFB both attain an active state of H level, SGF driver 32 shown in FIG. 19 enters an output high impedance state, and the selection gate line SGF enters a floating state.

When selection gate activation signal ENFB is activated and selection gate line SGF enters the floating state, gate boosting control circuit 44 drives selection gate enable signal ENC to an active state according to an output signal of gate selection control circuit 46. In response to this activation of selection gate enable signal ENC, SGC driver is activated to transmit the voltage Vcg to selection gate line SGC. In response to the rise of the voltage level of selection gate line SGC, the voltage level of selection line SGF also rises to the Vdd+Vcg level. During this period of time, selection gate activation signals ENFA and ENFB are in the active state of H level and selection gate line SGF is in the floating state.

When a predetermined operation (reading, writing, or erasure operation) is completed, main enable signal MEN is deactivated, and in response, control circuits 42, 44, 46 are deactivated, so that control signals XDE, ENC, ENFA and ENFB are driven to an inactive state of L level. In response, SGC driver 30 and SGF driver 32 shown in FIG. 19 are deactivated and selection gate lines SGC and SGF are each driven to an inactive state of ground voltage level.

Accordingly, only power supply voltage Vdd is supplied to selection gate line SGF and a boosting voltage generating unit for boosting the selection gate line is not required. Furthermore, the voltage level generated by the circuit for driving selection gate line SGC can be set low.

(Modification)

Figure 23:
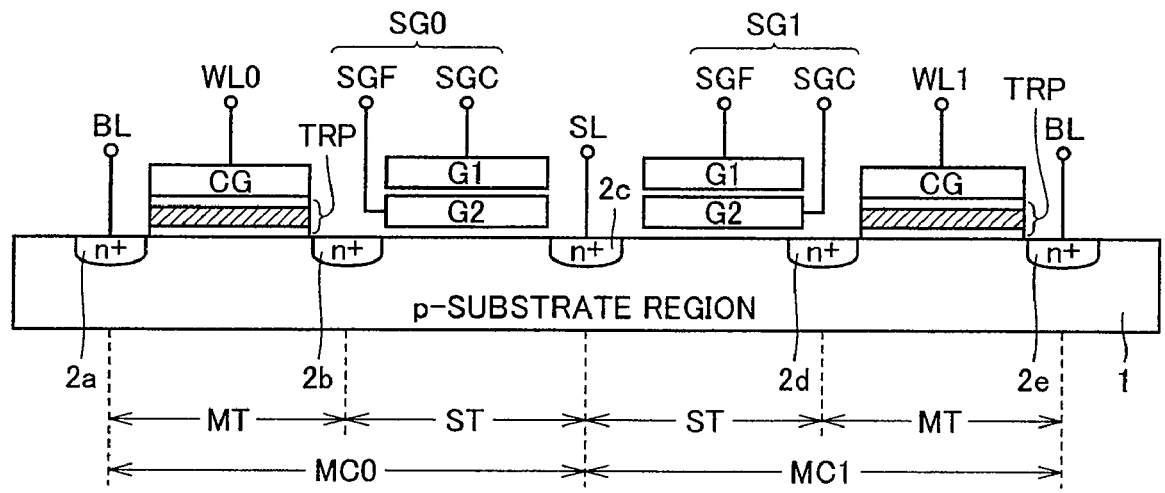
FIG. 23 is a diagram schematically showing a cross-sectional structure of memory cells of a modification of Embodiment 1 of the present invention.

FIG. 23 is a diagram schematically showing a modification of the nonvolatile semiconductor memory device according to Embodiment 1 of the present invention. In FIG. 23, a cross-sectional structure of memory cells MC0 and MC1 of two bits is schematically shown. In the construction of each of memory cells MC0 and MC1 shown in FIG. 23, memory cell transistor MT has a charge trap film TRP that stores information in the form of electric charges in place of the floating gate. On charge trap film TRP, control gate electrode CG is formed and is connected to word line WL (WL1, WL0). Charge trap film TRP is formed of an ONO film having a multilayer structure of oxide film-nitride film-oxide film, for example, and the electric charges are accumulated in the nitride film indicated by diagonal lines in the figure.

The other components of memory cells MC0 and MC1 shown in FIG. 23 are the same as the components shown in the cross-sectional structure of memory cells MC0 and MC 1 shown in FIG. 2 and the same reference numerals are allotted to the corresponding portions and their detailed description will not be repeated.

When charge trap film TRP formed of ONO film is utilized, lower layer gate electrode G2 of selection transistor ST is formed in the same manufacturing step as that of control gate electrode CG. Upper layer gate electrode G1 is formed above lower layer gate electrode G2. Accordingly, in selection transistor ST, one interconnection step is added to form the gate into the double layer structure. However, in a manufacturing steps for a transistor (logic transistor) included in the sequencer for operation control provided within the nonvolatile semiconductor memory device or a processor (microprocessor) integrated on the same chip with this nonvolatile semiconductor memory device, upper layer gate electrode G1 can be formed concurrently in forming a gate electrode layer of the logic transistor, so that an increase of the number of the manufacturing steps can be suppressed (in the case where a dual polysilicon gate process is utilized for the MOS transistor of the logic circuit).

A planar layout of memory cells MC0 and MC1 shown in FIG. 23 is the same as the layout of the memory cells shown in FIG. 7. Charge trap film TRP is arranged in place of the floating gate. Writing/reading/erasure operations of data are performed similarly to the case where the floating gate is used, as previously described (although the applied voltage level is different). In this case, by forming selection transistor ST into a double layer gate structure and by individually setting the voltage levels of selection gates G1 and G2, the circuit for generating positive and negative boosted voltages can be reduced in scale, and the chip layout area and current consumption can be reduced.

Figure 24:
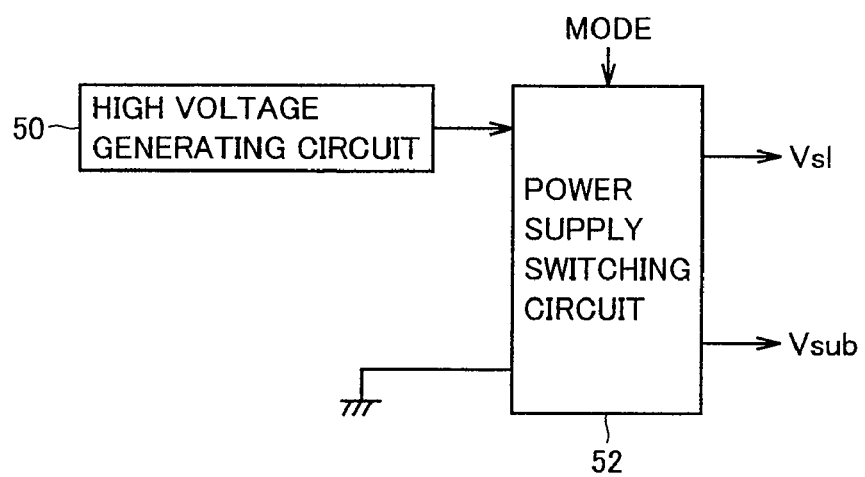
FIG. 24 is a diagram showing an example of a construction of a portion generating a source line voltage and a substrate voltage in Embodiment 1 of the present invention.

FIG. 24 is a diagram schematically showing a construction of a portion for generating voltages applied to the source line and the substrate region. In FIG. 24, a source/substrate voltage supplying portion includes a high voltage generating circuit 50 that generates a positive high voltage, and a power supply switching circuit 52 that selects either of high voltage generating circuit 50 and an ground voltage according to operation mode instruction signal MODE, to generate a source line voltage Vs1 and a substrate voltage Vsub.

Source line voltage Vs1 is supplied to source line SL and substrate voltage Vsub is supplied to p-type substrate region 1.

High voltage generating circuit 50 includes a charge pump circuit, a voltage level detecting circuit, and a pump operation control circuit responsive to the result of detection, and is distributedly disposed in pump circuit PUK and peripheral circuit PH shown in FIG. 4.

Power supply switching circuit 52 selects the ground voltage (0.0 V) for source line voltage Vs1 and substrate voltage Vsub in the data reading mode. In writing data, power supply switching circuit 52, similarly, selects the ground voltage to generate source line voltage Vs1 and substrate voltage Vsub. In the erasure mode, power supply switching circuit 52 selects a high voltage (for example, 9.5 V) from high voltage generating circuit 50 to generate source line voltage Vs1 and substrate voltage Vsub.

Power supply switching circuit 52 sets source line voltage Vs1 and substrate voltage Vsub to the output voltage of high voltage generating circuit 50 or the ground voltage level. The data writing (programming) is performed by generating and injecting channel hot electrons into floating gate FG, and the erasure is performed by utilizing F-N tunneling current to release the electrons from floating gate FG to the substrate region.

A portion for generating a bit line writing voltage and a bit line read out voltage which are supplied to bit line BL, is similarly constructed, using the construction of power supply switching circuit.

The power supply related circuit shown in FIG. 24 can be utilized for any of the memory cells utilizing the floating gate and the memory cells utilizing the charge trap film, and for the memory cell structure utilizing the charge trap film, the constructions shown in FIGS. 17 to 19 can be also utilized to generate the required voltages and to drive a selected memory cell.

As described above, according to Embodiment 1 of the present invention, a memory cell is comprised of a serial body of a selection transistor and a memory cell transistor, and the selection transistor has a double layer gate structure having each gate voltage level set individually. Accordingly, a boosting charge pump circuit for boosting a gate potential of the selection transistor can be unnecessary or the scale thereof can be reduced, so that the current consumption can be reduced and the chip layout area can be also reduced.

In addition, since the selection transistor is utilized, the threshold voltage of memory transistor MT can be made low and an over-erasure state can be permitted. Accordingly, in writing data, write-back processing of making the threshold voltage higher than a predetermined value to prevent the over-erasure state is not necessary. Consequently, the verification operation for verifying whether precise data reading is performed even in the presence of a memory cell in the over-erasure state is not necessary, the program operation (writing and erasure operation) sequence of the data is simplified, the scale of the control circuit (sequencer) can be reduced, and accordingly, the chip area can be reduced.

Furthermore, the threshold voltage of the selection transistor can be set relatively high (because the gate potential can be raised). Thus, even if the threshold voltage of the memory transistor is in a low state and even if the memory cell transistor is miniaturized, the path of a sub-threshold leakage current (off-leak current) of the memory cell transistor can be shut off by selection transistor ST, and accordingly, the current consumption in the stand-by state can be reduced.

Embodiment 2

Figure 25:
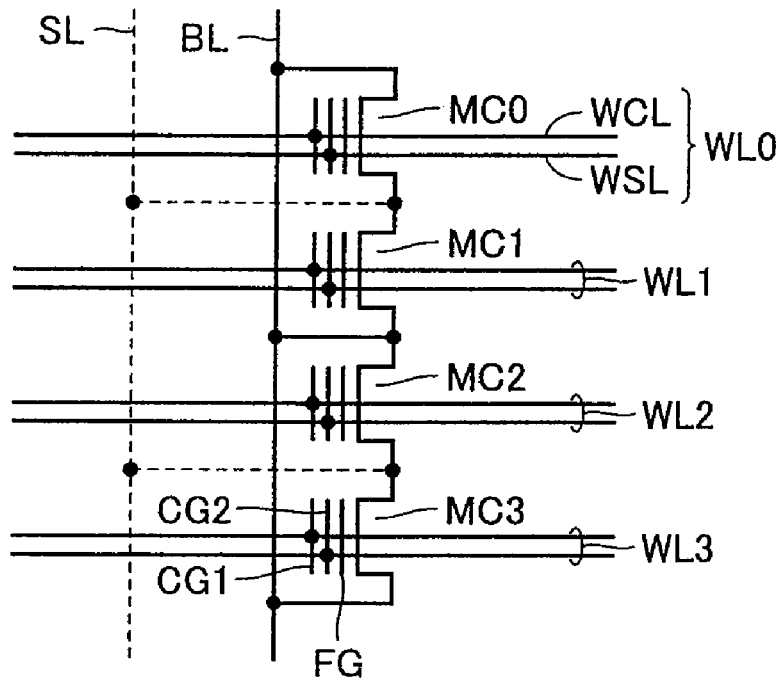
FIG. 25 is a diagram showing an electrical equivalent circuit of memory cells according to Embodiment 2 of the present invention.

FIG. 25 is a diagram schematically showing a construction of a nonvolatile memory cell array according to Embodiment 2 of the present invention. In FIG. 25, memory cells MC0 to MC3 of four bits disposed in alignment in one column are representatively shown. These memory cells MC0 to MC3 are connected to bit line BL in common and are connected to source line SL in common. These memory cells MC0 to MC3 are connected between bit line BL and source line SL in parallel each other.

Each of memory cells MC0 to MC3 has a three-layered gate structure and includes floating gate FG, and first and second control gate electrodes CG1 and CG2. For these memory cells MC0 to MC3, word lines WL0 to WL3 are arranged, respectively. Each of word lines WL0 to WL3 is connected to the memory cells arranged in alignment in one row in common.

Each of word lines WL0 to WL3 includes a word control line WCL and a word selection line WSL coupled to first and second control gate electrodes CG1 and CG2, respectively. Word selection line WSL and word control line WCL have the voltage levels set individually and separately.

Figure 26:
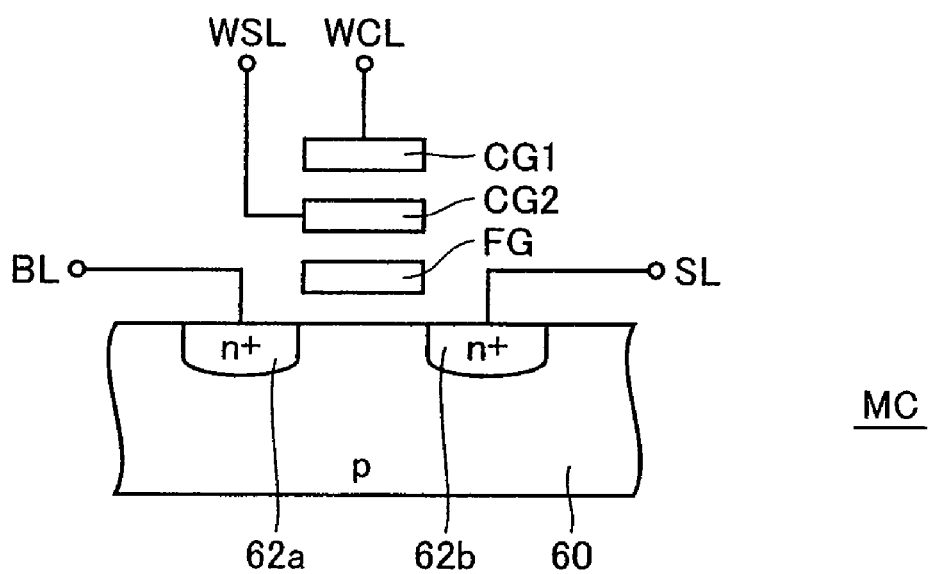
FIG. 26 is a diagram schematically showing a cross-sectional structure of the memory cell shown in FIG. 25.

FIG. 26 is a diagram schematically showing a cross-sectional structure of each of memory cells MC0 to MC3 shown in FIG. 25. Since these memory cells MC0 to MC3 have the same structure, memory cell MC is shown to represent these memory cells MC0 to MC3 in FIG. 26. Memory cell MC includes impurity regions 62a and 62b formed apart from each other on a surface of a p-type semiconductor substrate region 60, floating gate FG formed on a surface of the substrate region between impurity regions 62a and 62b, and second and first control gate electrodes CG2 and CG1 formed on floating gate FG. Floating gate FG is separated and isolated for each memory cell, while control gate electrodes CG2 and CG1 are respectively coupled by word selection line WSL and word control line WCL in common for the memory cells disposed in alignment in a row direction. Control gate electrode CG1 is coupled to word control line WCL and control gate electrode CG2 is coupled to word selection line WSL. Control gate electrodes CG1 and CG2 represent electrode regions of each memory cell, and word selection line WSL and word control line WCL are interconnection lines of the same interconnection layers as control gate electrodes CG1 and CG2, and are each formed of a polysilicon layer arranged linearly extending in the row direction.

Impurity region 62a is coupled to bit line BL and impurity region 62b is coupled to source line SL. Impurity region 62b is shared with an adjacent memory cell. Impurity region 62a is also shared with an adjacent memory cell.

Figure 27:
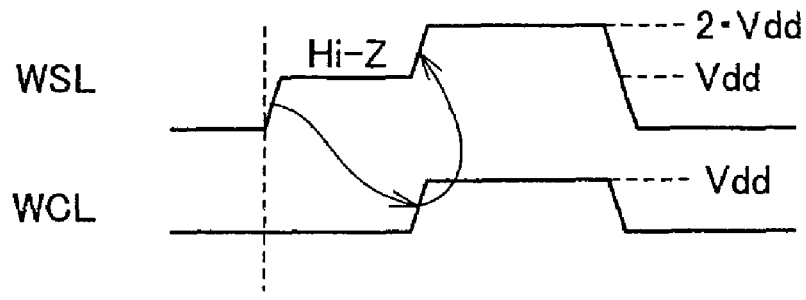
FIG. 27 is a diagram showing gate potential changes of the memory cell shown in FIG. 26 in reading data.

FIG. 27 is a diagram schematically representing potential changes of control gate electrodes CG1 and CG2 in reading storage data of memory cell MC shown in FIG. 26. Referring to FIG. 27, a brief description is given of the operation in reading data of memory cell MC shown in FIG. 26.

In reading data, a read out voltage (for example, 1.0 V) is supplied to bit line BL and source line SL is kept at the ground voltage level. Substrate region 60 is at the ground voltage level. Electric charges according the stored data are accumulated in floating gate FG.

Word selection line WSL is first driven to the power supply voltage Vdd level, and when its voltage level becomes stable, word selection line WSL is set to a floating state (high impedance state Hi-Z). At this time, the voltage level of word control line WCL remains at the ground voltage level. The voltage level of control gate electrode CG2 is kept at the power supply voltage Vdd.

Subsequently, when word selection line WSL attains the floating state, the voltage level of word control line WCL is driven to the power supply voltage Vdd. In response, through capacitive coupling between word selection line WSL and word control line WCL, that is, between control gate electrodes CG1 and CG2, the voltage level of word selection line WSL goes up to 2·Vdd level and the voltage level of second control gate electrode CG2 similarly goes up to the voltage level of 2·Vdd.

Thus, the threshold voltage of memory cell MC can be set to a level of 2·Vdd or lower or to a level of 2·Vdd or higher according to the storage information, and the threshold voltage can be set high to prevent the over-erasure state, and even if power supply voltage Vdd is low, a read out current according to the stored data of memory cell MC can be caused to precisely flow between bit line BL and source line SL. In this operation, only the power supply voltage is utilized, and it is not required to generate the voltage of 2·Vdd utilizing a charge pump internally, so that the current consumption can be reduced and the occupying area of the internal voltage generating portion can be reduced.

Furthermore, only the power supply voltage is utilized, as in Embodiment 1, it is unnecessary to delay the start of the word line selection operation until the internal voltages generated through charge pump operation become stable, so that high speed reading can be achieved.

In reading data, if the read out current corresponding to the threshold voltage according to the stored data of memory cell MC can be satisfactorily caused to flow between bit line BL and source line SL at the read out voltage level of power supply voltage Vdd, without causing the over-erasure failure, word selection line WSL and word control line WCL can be driven to the power supply Vdd level at the same timing. In this operation, even when a parasitic capacitance through an interlayer insulating film between word selection line WSL and word control line WCL is large, control gate CG2 can be driven to the power supply voltage Vdd level at high speed without being influenced by this parasitic capacitance.

Figure 28:
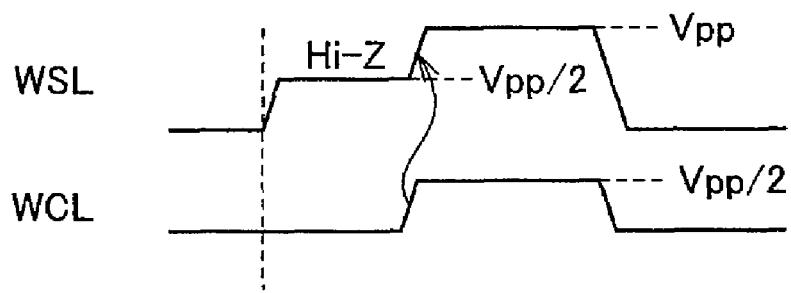
FIG. 28 is a diagram showing gate potential changes of the memory cell shown in FIG. 26 in writing data.

FIG. 28 is a diagram schematically showing voltage changes in writing data at the control gate of the memory cell shown in FIG. 26. In writing date, electrons are injected into floating gate FG. In this case, substrate region 60 is set to a negative voltage (for example, −9.5 V) and bit line BL is also set to the negative voltage −9.5V. Source line SL is in an open state (floating state). In this state, word selection line WSL is first driven to a ½ level of a final target voltage, that is, a voltage level of Vpp/2, and then, is kept in the floating state. At this time, word control line WCL is at the ground voltage level. When the voltage level of word selection line WSL becomes stable at the level of voltage Vpp/2, then, word control line WCL is driven to the voltage level of voltage Vpp/2. According to the voltage rise of word control line WCL by the capacitive coupling through the interlayer insulating film, the voltage level of word selection line WSL goes up to the level of the target voltage Vpp (for example, 9.5 V) and in response, the voltage level of control gate electrode CG2 is kept at the high voltage Vpp level. If the high voltage Vpp is 9.5 V, for example, a high voltage of about 19 V is applied between control gate electrode CG2 and substrate region 60, and with the high electric field, electrons are injected into floating gate FG from substrate region 60 by F-N tunneling current.

When data writing is completed, word selection line WSL and word control line WCL are both driven to the ground voltage level.

In the writing, even when high voltage Vpp is required, the pump circuit placed at the peripheral circuitry portion is only required to generate ½ times the high voltage, that is, a voltage of the Vpp/2 level. Consequently, the number of stages of the charge pumps for generating high voltage Vpp can be reduced and accordingly, the layout area and the current consumption can be reduced. In particular, in the case where high voltage Vpp is generated by boosting from power supply voltage Vdd through the charge pumping operation, and when power supply voltage Vdd is a low voltage (for example, 2.0 V), the number of stages of the charge pumps can be greatly reduced and the area saving effect and current consumption reduction effect become large.

Figure 29:
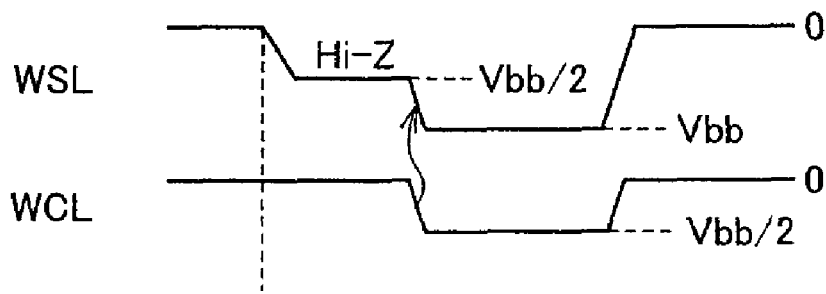
FIG. 29 is a diagram showing gate voltage changes of the memory cell shown in FIG. 26 in an erasure mode.

FIG. 29 is a diagram schematically showing voltage changes in the erasure at the control gates of the memory cell shown in FIG. 26. In the erasure mode, flash erasure (collective erasure) to the memory cells formed on substrate region 60 is executed. High voltage Vpp is supplied to bit line BL and substrate region 60 and source line SL is set to a floating state. In this state, word selection line WSL is first driven to the level of ½ times a target negative voltage Vbb, that is, the level of Vbb/2 and then, is kept in the floating state. At this time, word control line WCL is at the ground voltage level.

When the voltage level of word selection line WSL becomes stable at the level of voltage Vbb/2, word control line WCL is subsequently driven to the level of voltage Vbb/2. In response, the voltage level of word selection line WSL decreases by voltage Vbb/2 by the capacitive coupling through the interlayer insulating film, so that the voltage level attains the level of target negative voltage Vbb. Accordingly, in the case of negative voltage Vbb being −9.5 V, substrate region 60 is at the high voltage of 9.5 V and electrons flow out form floating gate FG into substrate region 60 by F-N tunneling current.

Accordingly, in the erasure operation, the level of negative voltage necessary for the erasure operation can also be halved, and similarly to the case of generating the high voltage, the number of pump stages in the charge pump circuit and the power consumption can be reduced.

As the voltage of bit line BL, high voltage Vpp and negative voltage Vbb are generated by a bit line voltage generating portion to be supplied. However, in a generator for generating a voltage to drive a word line, the voltage level required in each of the operation modes can be made lower and the power consumption of the generating portion for generating the voltage to drive the word line can be reduced and the memory chip layout area can be reduced.

Figure 30:
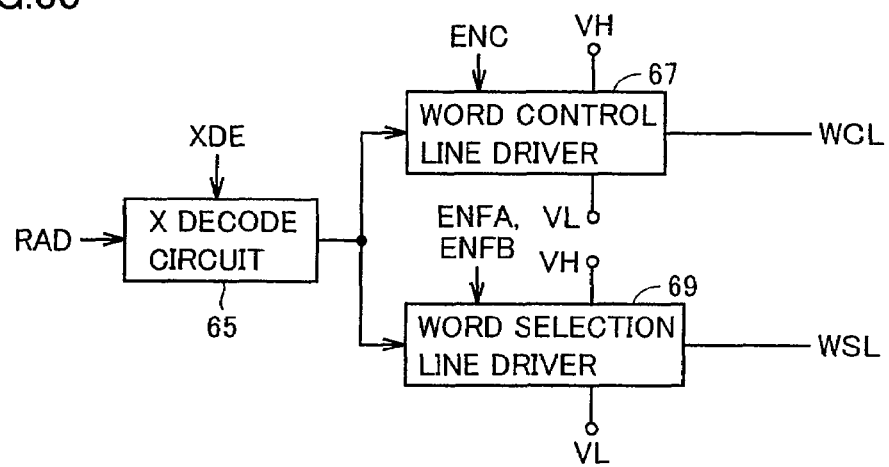
FIG. 30 is a diagram schematically showing an example of a construction of a word line control unit that generates the voltage changes shown in FIGS. 27 to 29.

FIG. 30 is a diagram schematically showing a construction of word line driving circuitry according to Embodiment 2 of the present invention. In FIG. 30, the word line driving circuitry includes an X decode circuit 65 that decodes row address signal RAD, a word control line driver 67 that has a selected/non-selected state determined according to an output signal of X decode circuit 65, and drives word control line WCL to a selected/non-selected state when in the selected state, and a word selection line driver 69 that selectively drives word selection line WSL to the selected state according to a decode signal from X decode circuit 65.

When selected, according to activation signal ENC, word control line driver 67 drives word control line WCL to either one of the power supply voltage, the high voltage and negative voltage based on a voltage applied to power supply nodes VH and VL.

Word selection line driver 69 has the operation timing according to activation signals ENFA and ENFB determined, and drives word selection line WSL to the voltage levels applied to the power supply nodes VH and VL.

X decode circuit 65, word control line driver 67 and word selection line driver 69 are included in each block of row decoders XD1-XDn shown in FIG. 4, and are arranged corresponding to word control line WCL and word selection line WSL.

In the nonvolatile semiconductor memory device according to Embodiment 2 of the present invention, since a selection transistor is not provided, the blocks of SG decoders/drivers SDD1 to SDDn are not provided. Except for this, the arrangement of the memory circuit shown in FIG. 4 can also apply in Embodiment 2.

Activation signals XDE, ENC, ENFA and ENFB are activated at timings similar to the timings of the activation signals shown in FIGS. 17 to 19.

Figure 31:
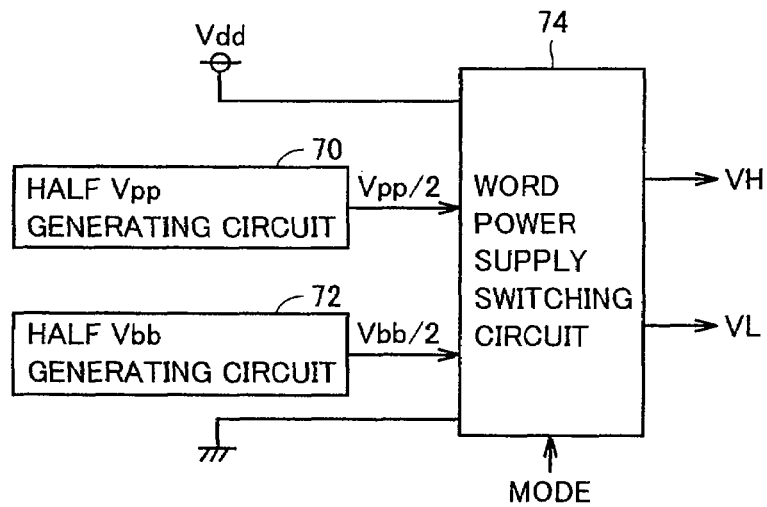
FIG. 31 is a diagram schematically showing a construction of a portion generating a high-side voltage and a low-side voltage for the word line shown in FIG. 30.

FIG. 31 is a diagram schematically showing a construction of a row related power supply circuitry that generates voltages applied to power supply nodes VH and VL of drivers 67 and 69 shown in FIG. 30. The voltages from the row related power supply circuitry are supplied to power supply nodes VH and VL of drivers 67 and 69 in common.

In FIG. 31, the row related power supply circuitry includes a half Vpp generating circuit 70 that generates a voltage Vpp/2, a half Vbb generating circuit 72 that generates a voltage Vbb/2, and a word power supply switching circuit 74 that selects one of power supply voltage Vdd, high voltage Vpp/2, and negative voltage Vbb/2 according to operation mode instruction signal MODE for transmission to high-side power supply node VH and low-side power supply node VL.

Word power supply switching circuit 74, in the reading mode, selects and supply power supply voltage Vdd and the ground voltage to high-side power supply node VH and low-side power supply node VL, respectively. In the writing mode, word power supply switching circuit 74 selects and supplies voltage Vpp/2 from half Vpp generating circuit 70 to high-side power supply node VH, and selects and transmits the ground voltage to low-side power supply node VL.

In the erasure mode, word power supply switching circuit 74 selects and transmits negative voltage Vbb/2 from half Vbb generating circuit 72 to low-side power supply node VL, and transmits the ground voltage to high-side power supply node VH.

Drivers 67 and 69 have the same voltage levels at respective power supply nodes VH and VL. The power supply circuit need not be disposed for each of drivers 67 and 69, and the construction of the power supply circuit can be simplified to reduce the layout area.

Activation signals ENC, ENFA and ENFB applied to drivers 67 and 69 as shown in FIG. 30 are generated utilizing the construction of the control circuitry shown in FIG. 21. In place of the control gates (G11, G2) of selection transistor in Embodiment 1, control gate electrodes CG1 and CG2 are driven through word control line WCL and word selection line WSL. Accordingly, word control line WCL and word selection line WSL can be driven at the same timings as those of selection gate lines SGC and SGF in Embodiment 1.

When the negative voltage and high voltage are generated, level conversion of the control signals is executed as necessary internally in each of drives 67 and 69 and word power supply switching circuit 74, to achieve precise voltage switching.

(Modification)

Figure 32:
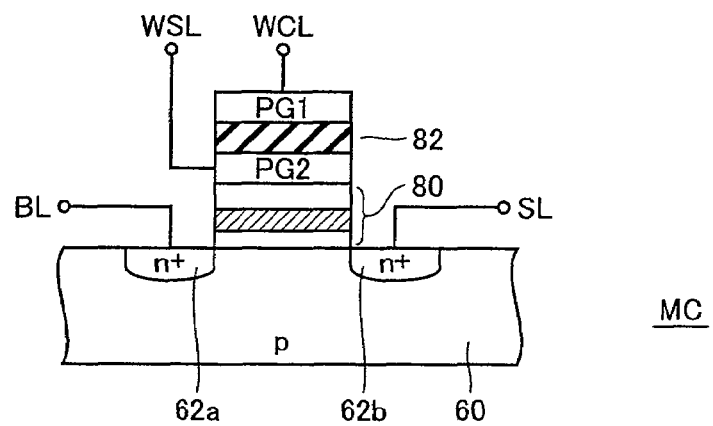
FIG. 32 is a diagram schematically showing a structure of the memory cell of a modification of Embodiment 2 of the present invention.

FIG. 32 is a diagram schematically showing a construction of memory cell MC of a modification of Embodiment 2 of the present invention. In FIG. 32, memory cell MC includes a charge trap film (accumulation film) 80 formed between impurity regions 62a and 62b formed at the surface of substrate region 60. The charge trap film 80 is comprised of an ONO film of oxide film-nitride film-oxide film and the electric charges (electrons) are accumulated in the nitride film as indicated by diagonal lines in the figure according to storage information.

Polysilicon gates PG2 and PG1 are formed in alignment above the charge trap film 80. An interlayer insulating film 82 is formed between polysilicon gates PG1 and PG2 and a parasitic capacitance is formed between polysilicon gates PG1 and PG2. These polysilicon gates PG1 and PG2 correspond to control gate electrodes CG1 and CG2 as previously described, respectively. Polysilicon gate PG2 is coupled to word selection line WSL and polysilicon gate PG1 is coupled to word control line WCL.

In the case where memory cell MC shown in FIG. 32 is used, charge trap film 80 comprised of the ONO film is used in place of the floating gate. In the case of such construction, the memory cell can be lower in height than the structure in which the floating gate is used. Even if memory cell MC is formed into a multilayer polysilicon gate structure, a step (height difference) with a single gate transistor in a circuit at a peripheral portion inside of the memory device or in the processor or others on the same chip can be mitigated.

When charge trap film 80 is used, the movement of accumulated electric charges is small and the electric charges are accumulated only under polysilicon gate PG2. Accordingly, even if charge trap film 80 is arranged extending linearly and continuously in the row line direction, precise storage of data can be achieved. Thus, in the planar layout shown in FIG. 7, the memory cell can be formed with charge trap film 80 being linearly extended along bit line BL in place of floating gate FG, (in the layout of FIG. 7, the selection gates are used as the word line (WCL, WSL). The region for isolating and separating the floating gates can be eliminated to reduce the memory size.

Furthermore, for a layout of word control line WCL and word selection line WSL, a layout similar to that of interconnections SGC and SGF for selection gates G1 and G2 (refer to FIG. 10) can be utilized, and word selection line WSL and word control line WCL are coupled to the word control line driver and the word selection line driver at an end portion, respectively. In addition, in this construction, word selection line WSL and word control line WCL may be coupled to the word selection line driver and word control line driver at end portions opposed to each other. Since for one word line (WCL, WSL), the word control line driver and the word selection line driver are disposed, at either ends, being opposite to each other (the word control line driver is disposed at one end, and the word selection line driver is disposed at the other end), the word control line driver and the word selection line driver can be laid out at the same pitch as that of the X decode circuit.

As described above, according to Embodiment 2 of the present invention, a conductive layer is further formed above a conductive layer above the charge accumulation region (charge trap film or floating gate) and the voltage level of these conductive layers is set individually. Accordingly, using the capacitive coupling between these conductive layers of the memory cell, the boosting operation can be performed and the generated voltage level of the circuit for generating a voltage for driving a word line can be reduced. Thus, when a charge pump is used, the number of pumping stages in the pump circuit can be reduced, so that the power consumption and the layout area can be reduced. Furthermore, even if the power supply voltage is low, the gate potential of the memory cell can be made high in data reading, and under the state in which the threshold voltages are distributed at high voltage levels, precise reading of memory cell data can be performed, and the problems of off-leak current and over-erasure can be avoided.

Embodiment 3

Figure 33:
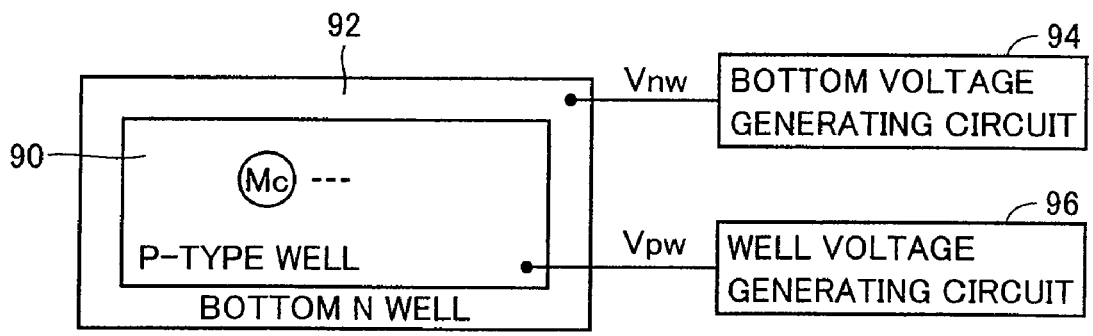
FIG. 33 is a diagram schematically showing a construction of a main portion of a nonvolatile semiconductor memory device according to Embodiment 3 of the present invention.

FIG. 33 is a diagram schematically showing a construction of a main portion of a nonvolatile semiconductor memory device according to Embodiment 3 of the present invention. In FIG. 33, a bottom N well 92 is provided in a circumference (outer periphery) of a p-type well 90. In p-type well 90, memory cells MC are formed, and word lines, bit lines and source lines are arranged corresponding to the memory cells. Namely, p-type well 90 is used for forming the memory cells.

Memory cell MC may be a stacked gate transistor having a floating gate (FG), or may be configured to have a charge trap film (ONO film). The floating gate and the charge trap film are collectively referred to as an electric charge accumulation region.

To bottom N well 92A, a well voltage Vnw from a bottom voltage generating circuit 94 is supplied, and to p-type well 90, a well voltage (substrate voltage) Vpw from a well voltage generating circuit 96 is supplied.

Figure 34:
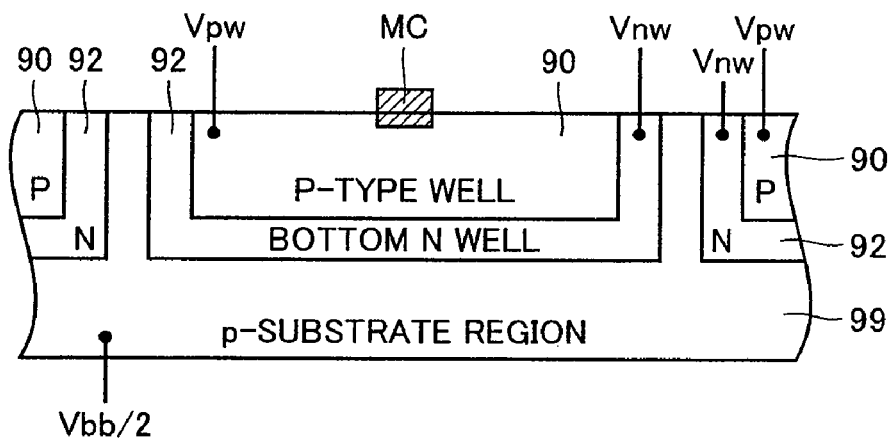
FIG. 34 is a diagram schematically showing a cross-sectional structure of well/substrate regions shown in FIG. 33.

FIG. 34 is a diagram schematically showing a cross-sectional structure of the bottom N well and p-type well 90 shown in FIG. 33. Bottom N well 92 is formed so as to surround side portions and a bottom portion of p-type well 90. Bottom N well 92 is formed at a surface of a p-type substrate region 99. In the nonvolatile semiconductor memory device previously shown in FIG. 4, the p-type wells 90 are divided corresponding to the respective memory array blocks, and are each isolated from the substrate regions of other memory array blocks by bottom N wells 92. This well isolation prevents the propagation of substrate noise and implements the block-basis erasure by setting a substrate voltage for each memory array block.

Bottom N well 92 is formed for each p-type well 90 and in FIG. 34, a part of adjacent p-type wells 90 and a part of associated bottom N wells 92 are shown.

At the surface of the p-type well 90, active regions are formed corresponding to the respective memory cells MC, and the memory cell is formed in each of the active regions. As a structure of the memory cell, the memory cell structures described in Embodiments 1 and 2 may be used, or a memory cell structure similar to a conventional one may be used, so that the memory cell structure is any. In FIG. 34, the memory cell structure is merely indicated by a diagonally lined block MC and a specific structure is not shown explicitly.

For each p-type well 90, substrate voltage Vpw is set and for each bottom N well 92, the voltage level is also set.

Figure 35:
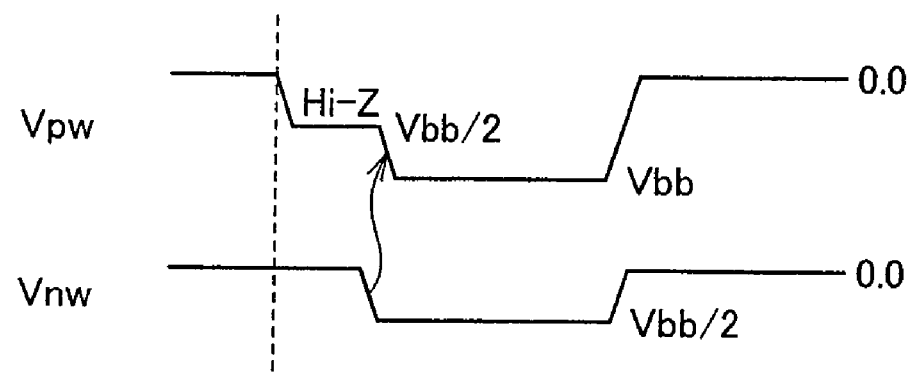
FIG. 35 is a diagram schematically showing voltage changes of the construction shown in FIGS. 33 and 34 in writing data.

FIG. 35 is a diagram showing voltage changes of p-type well 90 and bottom N well 92 shown in FIGS. 33 and 34 in data writing. Referring to FIG. 35, well voltage application in data writing will be described.

As shown in FIG. 35, in writing data, well voltage Vpw from well voltage generating circuit 96 is first lowered from the ground voltage level to the voltage level of negative voltage Vbb/2. At this time, bottom well voltage Vnw from bottom voltage generating circuit 94 is kept at the ground voltage level. When well voltage Vpw becomes stable at the level of voltage Vbb/2, well voltage generating circuit 96 enters an output high impedance state and responsively p-type well 90 attains a floating state (Hi-Z). Subsequently, bottom well voltage Vnw from bottom voltage generating circuit 94 is lowered by voltage Vbb/2 from the ground voltage. Accordingly, by capacitive coupling through a PN junction capacitance between p-type well 90 and bottom N well, the potential of p-type well 90 lowers to the voltage Vbb level. Among the memory cells, for the memory cell to which the writing is performed, the gate potential is kept at a positive high voltage level and electrons are injected from p-type well 90 into an electric charge accumulation region (floating gate or charge trap film (ONO film)) of the selected memory cell.

After the writing operation is completed, these well voltages Vnw and Vpw both return to the ground voltage level.

Accordingly, the voltage that the internal power supply circuit is required to generate in the writing operation is the voltage Vbb/2, which is ½ times the target voltage Vbb, and the absolute value of the voltage level of the negative voltage necessary for writing can be made small, so that the number of charge pumping stages for generating the negative voltage can be reduced and accordingly, the layout area and the current consumption can be reduced.

Figure 36:
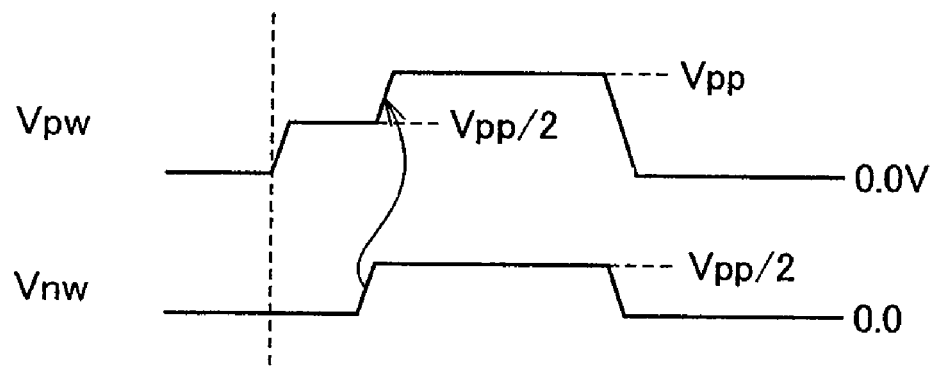
FIG. 36 is a timing diagram showing voltage changes in the structure shown in FIGS. 33 and 34 in erasing data.

FIG. 36 is a diagram showing changes of the well voltage Vpw and bottom voltage Vnw shown in FIGS. 33 and 34 in erasure operation.

In the erasure operation mode, erasure operation is collectively performed to memory cells MC formed in p-type well 90. In this operation, well voltage Vpw from well voltage generating circuit 96 is first raised from the ground voltage to the voltage level of Vpp/2. Bottom voltage Vnw is at the ground voltage level. When voltage Vpw of p-type well 90 becomes stable at the level of voltage Vpp/2, well voltage generating circuit 96 enters an output high impedance state, and p-type well 90 is set into a floating state at the level of voltage Vpp/2. Subsequently, bottom voltage generating circuit 94 raises bottom well voltage Vnw to the level of voltage Vpp/2. In response, by capacitive coupling through pn junction capacitance between p-type well 90 and bottom N well 92, the voltage level of p-type well 90 rises up by Vpp/2 to the voltage Vpp level. At this time, for the memory cell MC formed in p-type well 90, the gate potential is set to the negative voltage level, and electrons flow out from the electric charge accumulation region (floating gate or charge trap film (ONO film)) to p-type well 90. When the erasure operation is completed, these voltage Vpw and Vnw are both driven to the ground voltage level.

In the writing mode, bottom N well 92 is kept at the voltage level of negative voltage Vbb/2. In this operation, p-type substrate region 99 is kept at the voltage level of negative voltage Vbb/2 and the pn junction between bottom N well 92 and p-type substrate region 99 is kept in a non-conductive state. In this case, p-type substrate region 99 may be normally kept at the level of negative voltage Vbb/2, or may be kept at negative voltage Vbb/2 or at the ground voltage level, according to the operation mode. P-type substrate region 99 is a well region and is provided for the memory cell arrays (all memory array blocks) in common, but is isolated from the peripheral circuit region. The voltage level of the substrate region and the voltage levels of the well regions can be set in the memory array without influencing the substrate potential of the peripheral circuit transistor during the operation of the peripheral circuit.

Figure 37:
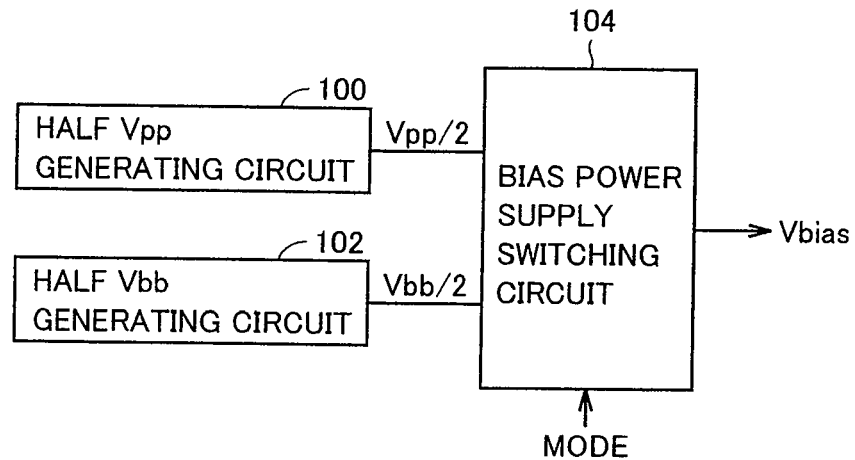
FIG. 37 is a diagram showing an example of a construction of a well/substrate voltage generating unit that generates the voltages shown in FIGS. 33 and 34.

FIG. 37 is a diagram schematically showing an example of a construction of a portion for generating the voltages Vnw and Vpw. In FIG. 37, a substrate/well voltage generating portion includes a half Vpp generating circuit 100 that generates high voltage Vpp/2 for the well, a half Vbb generating circuit 102 that generates negative voltage Vbb/2 for the substrate, and a bias power supply switching circuit 104 that selects one of voltages Vpp/2 and Vbb/2 according operation mode instruction signal MODE, to generate a bias voltage Vbias. Half Vpp generating circuit 100 and half Vbb generating circuit 102 each include a charge pump included in pump circuit PUK and a voltage level control circuit included in peripheral circuit PH (pump circuit PUK and peripheral circuit PH are shown in FIG. 4). Bias power supply switching circuit 104 is included in peripheral circuit PH shown in FIG. 4.

Bias power supply switching circuit 104 selects positive high voltage Vpp/2 in the erasure mode and negative high voltage Vbb/2 in the writing mode, to output the selected voltages as bias voltage Vbias.

Bias power supply switching circuit 104 keeps bias voltage Vbias at the ground voltage level when operation mode instruction signal MODE instructs the reading mode or the stand-by mode.

Figure 38:
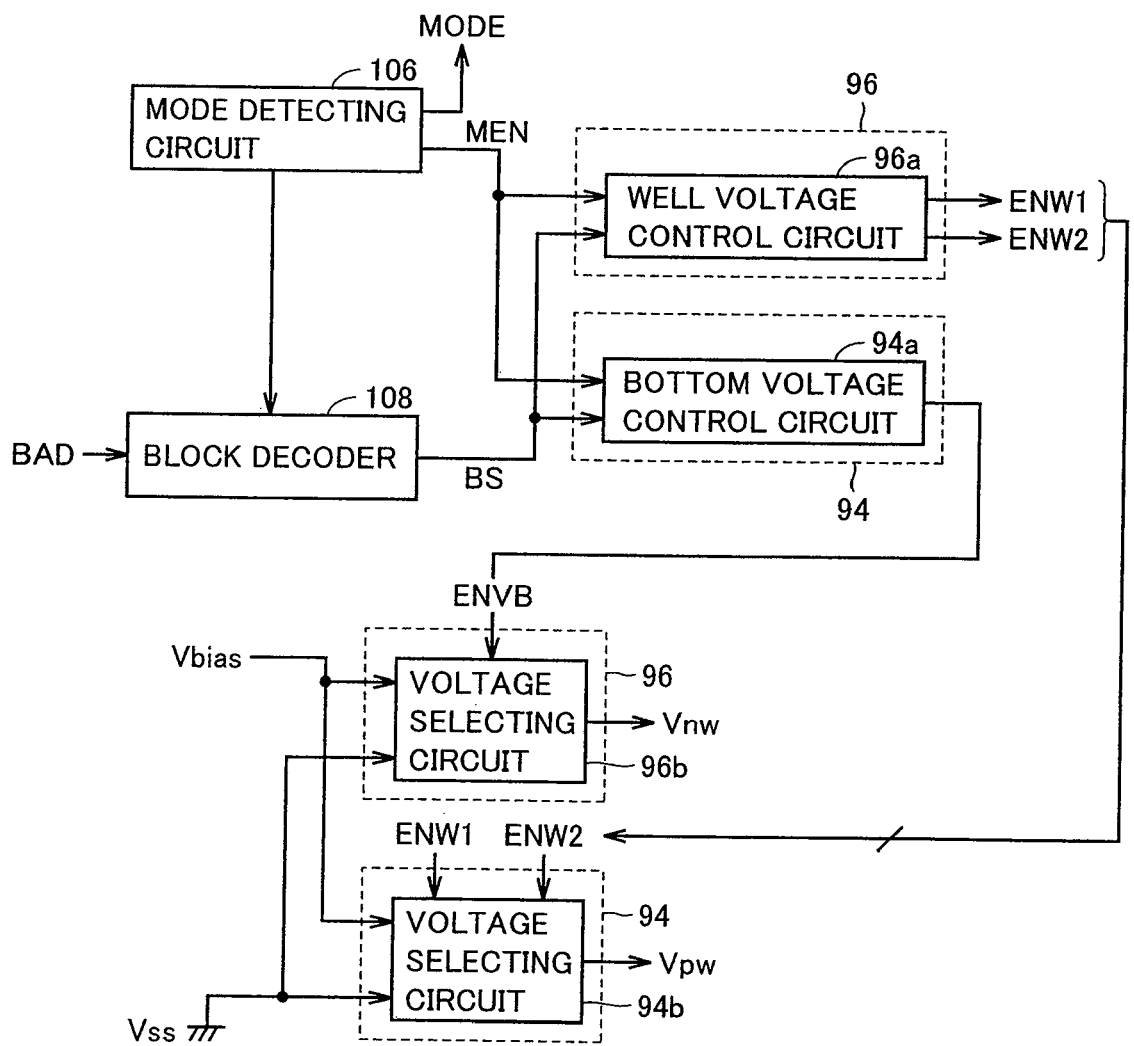
FIG. 38 is a diagram schematically showing a construction of a bottom voltage generating circuit and a well voltage generating circuit shown in FIG. 33.

FIG. 38 is a diagram schematically showing a construction of bottom voltage generating circuit 94 and well voltage generating circuit 96 shown in FIG. 33. In order to control the operation of bottom voltage generation circuit 94 and well voltage generating circuit 96, there are provided a mode detecting circuit 106 that detects the operation mode according to a command, and a block decoder 108 that is activated according to an operation mode instruction signal from mode detecting circuit 106 and decodes a block address BAD to generate a block selection signal BS when in the active state. By block selection signal BS from block decoder 108, one of memory array blocks #1 to #n shown in FIG. 4 is specified. Operation mode instruction signal MODE from the mode detecting circuit 106 is applied to bias power supply switching circuit 104 shown in FIG. 37.

Bottom voltage generating circuit 94 includes a bottom voltage control circuit 94a that generates a voltage switching control signal ENVB according to activation signal MEN from mode detecting circuit 106 and block selection signal BS from block decoder 108, and a voltage selecting circuit 96b that selects one of bias voltage Vbias and ground voltage Vss (0.0 V) according to voltage switching control signal ENVB from bottom voltage control circuit 94a, to generate bottom well voltage Vnw.

Well voltage generating circuit 96 includes a well voltage control circuit 96a that generates voltage selection control signals ENW1 and ENW2 according to activation signal MEN from mode detecting circuit 106, and a voltage selecting circuit 94b that selects one of bias voltage Vbias and ground voltage Vss to generate well voltage Vpw when voltage selection control signals ENW1 and ENW2 from this well voltage control circuit 96a are activated.

Block selection signal BS is activated only for a selected memory array block. When block selection signal BS is in an inactive state, control signals ENW1, ENW2 and ENVB from well voltage control circuit 96a and bottom voltage control circuit 94a are in an inactive state. In this state, voltage selecting circuits 96b and 94b select ground voltage Vss (0.0 V) to generate bottom N well voltage Vnw and well voltage Vpw, respectively.

When block selection signal BS is activated, according to activation control signal MEN from mode detecting circuit 106, well voltage control circuit 96a and bottom voltage control circuit 94a generate voltage selection control signals ENW1, ENW2 and voltage switching control signal ENVB at predetermined timings, respectively. According to these control signals ENVB and ENW1, ENW2, voltage selecting circuits 96b and 94b select bias voltage Vbias and outputs the selected voltage at the predetermined timings, to generate the voltages Vnw and Vpw. Voltage selecting circuit 96b first selects the ground voltage. Voltage selecting circuit 94b selects bias voltage Vbias to generate well voltage Vpw.

Subsequently, when voltage selection control signal ENW2 attains an activate state, voltage selecting circuit 94b enters an output high impedance state. According to the timing of this output high impedance state of voltage selecting circuit 94b, voltage switching control signal ENVB is activated and voltage selecting circuit 96b generates the voltage Vnw according to bias voltage Vbias. Thereby, voltages Vpw and Vnw having voltage waveforms shown in FIGS. 35 and 36 can be generated.

It is sufficient to form voltage selecting circuits 96b and 94b with a multiplexer having a selection function. Furthermore, in order to perform the voltage selection by surely setting the selecting path to a conduction/shut off state according to the voltage level to be generated, voltage selecting circuits 94b and 96b each have a function of conversion of a route switching control signal internally.

Thereby, only for the selected memory array block, well voltage Vpw and bottom well voltage Vnw can be generated according to bias voltage Vbias, and for the other non-selected memory array blocks, voltages Vnw and Vpw can be kept at the ground voltage Vss level.

In this case, the substrate region (99) provided in common to the memory array blocks is set to the voltage level of negative voltage Vbb/2 in the writing operation mode, and is set to the ground voltage level in the erasure and reading modes.

Figure 39:
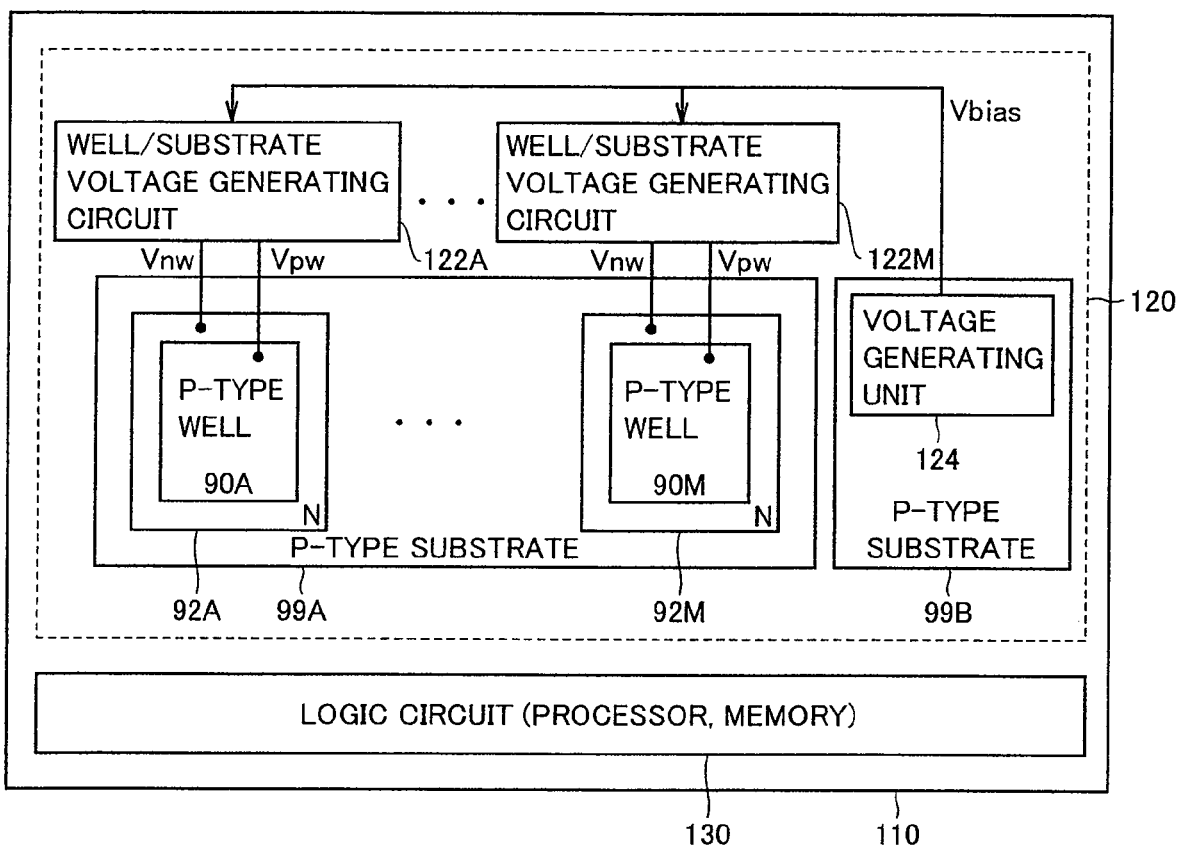
FIG. 39 is a diagram schematically showing a chip layout of a system LSI including the nonvolatile semiconductor memory device according to Embodiment 3 of the present invention.

FIG. 39 is a diagram schematically showing a layout on a semiconductor chip of system LSI containing the nonvolatile semiconductor memory device according to Embodiment 3 of the present invention. In FIG. 39, a nonvolatile semiconductor memory device 120 is formed on a semiconductor chip 110. On semiconductor chip 110, a logic circuit 130 including a processor and a boot memory and a working memory such as ROM (read only memory) or RAM (random access memory) is also formed. The nonvolatile semiconductor memory device 120 stores at least data/programs that logic circuit 130 needs. In this case, nonvolatile semiconductor memory device 120 may be utilized as a memory that stores a boot program of logic circuit 130. With this semiconductor chip 110, a microprocessor with an embedded memory is achieved.

Nonvolatile semiconductor memory device 120 includes a p-type substrate region 99A on which the memory arrays are formed and a p-type substrate region 99B on which the peripheral circuit (including a sequencer), power supply circuit and others except these memory arrays are formed. These p-type substrate regions 99A and 99B are separated and isolated from each other. On p-type substrate region 99A, there are provided p-type wells 90A to 90M corresponding to the respective memory array blocks, and bottom N wells 92A to 92M corresponding to the p-type wells 90A to 90M, respectively. Well/substrate voltage generating circuits 122A to 122M are provided corresponding to the respective blocks of p-type wells 90A to 90M and bottom N wells 92A to 92M. These well/substrate voltage generating circuits 122A to 122M each include well voltage generating circuit 96 and bottom voltage generating circuit 94 shown in FIG. 33, for supplying the voltage Vpw and voltage Vnw to the corresponding p-type well and bottom N well, respectively.

Well/substrate voltage generating circuits 122A to 122M are commonly supplied with bias voltage Vbias from a voltage generating unit 124 provided on p-type substrate region 99B. Voltage generating unit 124 also includes the circuits that generate other voltages supplied to the word lines, bit lines, and source lines, such as high voltages Vpp, Vpp/2, Vbb, and Vbb/2. Accordingly, in this p-type substrate region 99B, the peripheral circuit, power supply circuit, and the sequencer in the layout shown in FIG. 4 are arranged.

By arranging p-type substrate regions 99A and 99B separately with each other on semiconductor chip 110 in the form of well regions, nonvolatile semiconductor memory device 120 can be operated stably with low power consumption without exerting any influence by the bias voltages (well voltage and substrate voltage) used by the memory array portion and the bias voltages generated by the voltage generating portions in the peripheral circuit, on the substrate region on which logic circuit 130 is formed.

The constructions of Embodiments 1 and 2 may be applied in Embodiment 3 as necessary.

As described above, according to Embodiment 3 of the present invention, the bottom well region is formed surrounding the well region on which the memory cells are arranged in rows and columns, and the voltage of the well region is set by using junction capacitance between the bottom region and the corresponding well region. Accordingly, the absolute value of the voltage level generated by the voltage generating portion for setting the well voltage can be made small, and the current consumption and the layout area of the voltage generating portion can be reduced.

The present invention can be applied to a general nonvolatile semiconductor memory device. Particularly, when the present invention is applied to a nonvolatile semiconductor memory device which is integrated on a common semiconductor chip with a logic circuit such as a processor, a system LSI (Large Scale Integrated circuit) with a low current consumption and capable of reducing a chip area can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device comprising:
    a memory cell formed on a substrate of a first conductivity type, for storing information in a nonvolatile manner, said memory cell including an electric charge accumulation region formed on said substrate region and storing said information in an electric charge form, and a control electrode layer formed on said electric charge accumulation region and receiving a voltage for writing and reading storage information of said memory cell;
    a bottom well of a second conductivity type region formed surrounding bottom and side portions of said substrate region;
    a first voltage control circuit for setting a voltage of said substrate region; and
    a second voltage control circuit operating individually and separately from voltage setting by said first voltage control circuit, for setting a voltage of said bottom well region according to an operation mode, to adjust the voltage level of said substrate region.

* * * * *